US012650646B2

(12) United States Patent
Kandanarachchi

(10) Patent No.: US 12,650,646 B2
(45) Date of Patent: Jun. 9, 2026

(54) PHOTOSENSITIVE POLYIMIDE COMPOSITIONS

(71) Applicant: PROMERUS, LLC, Akron, OH (US)

(72) Inventor: Pramod Kandanarachchi, Akron, OH (US)

(73) Assignee: PROMERUS, LLC, Akron, OH (US)

( * ) Notice: Subject to any disclaimer, the term of this patent is extended or adjusted under 35 U.S.C. 154(b) by 207 days.

(21) Appl. No.: 18/609,813

(22) Filed: Mar. 19, 2024

(65) Prior Publication Data

US 2024/0288770 A1 Aug. 29, 2024

Related U.S. Application Data

(62) Division of application No. 16/809,566, filed on Mar. 5, 2020, now abandoned.

(60) Provisional application No. 62/813,940, filed on Mar. 5, 2019.

(51) Int. Cl.

| | |
|---|---|
| ***G03F 7/038*** | (2006.01) |
| ***C08G 73/10*** | (2006.01) |
| ***C08G 73/12*** | (2006.01) |
| ***G03F 7/004*** | (2006.01) |

(52) U.S. Cl.

CPC ......... *G03F 7/0387* (2013.01); *C08G 73/101* (2013.01); *C08G 73/1025* (2013.01); *C08G 73/1032* (2013.01); *C08G 73/1085* (2013.01); *C08G 73/122* (2013.01); *C08G 73/124* (2013.01); *G03F 7/0045* (2013.01)

(58) Field of Classification Search

None

See application file for complete search history.

(56) References Cited

U.S. PATENT DOCUMENTS

| | | | |
|---|---|---|---|
| 5,310,863 | A | 5/1994 | Sachdev |
| 2008/0108723 | A1 | 5/2008 | Taniguchi et al. |
| 2009/0176172 | A1 | 7/2009 | Yamanaka et al. |

(Continued)

FOREIGN PATENT DOCUMENTS

| | | | |
|---|---|---|---|
| JP | 6171573 B2 | 8/2017 | |
| WO | WO-2018181311 A1 * | 10/2018 | ............. G03F 7/105 |

OTHER PUBLICATIONS

Written Opinion of PCT/US2020/021048, Sep. 6, 2020; Also see WO2020/181021 A1, Sep. 10, 2020.

(Continued)

*Primary Examiner* — Rachel Kahn
(74) *Attorney, Agent, or Firm* — Balaram Gupta

(57) ABSTRACT

Embodiments in accordance with the present invention encompass photosensitive compositions containing a variety of soluble polyimide polymers and various additives including photoacid generator, photo radical generator and one or more photo crosslinking agents which are useful for forming films that can be patterned to create structures for microelectronic devices, microelectronic packaging, microelectromechanical systems, optoelectronic devices and displays. In some embodiments the compositions of this invention are shown to feature excellent hitherto unachievable mechanical properties. The negative images formed therefrom can be readily cured at lower temperatures than the conventional polyimides and exhibit improved thermo-mechanical properties, among other property enhancements.

18 Claims, 3 Drawing Sheets

(56) References Cited

U.S. PATENT DOCUMENTS

| | | | | |
|---|---|---|---|---|
| 2011/0130485 | A1* | 6/2011 | Mizori | C08G 73/12 522/167 |
| 2012/0190802 | A1 | 7/2012 | Poe et al. | |
| 2015/0219990 | A1* | 8/2015 | Malik | G03F 7/0387 428/375 |
| 2017/0165879 | A1 | 6/2017 | Miyamoto et al. | |
| 2018/0024434 | A1 | 1/2018 | Takemura et al. | |
| 2018/0215874 | A1 | 8/2018 | Kawabata et al. | |
| 2020/0110337 | A1 | 4/2020 | Tanigaki et al. | |

OTHER PUBLICATIONS

Polyimides: Fundamentals and Applications; ISBN: 0-8247-9466-4; Edited by Malay K. Ghosh and K. L. Mittal, 1996, p. 208.

Handbook of Thermoset Plastics; ISBN: 978-1-4557-3107-7; Edited by Hanna Dodiuk and Sidney H. Goodman, Third Edition, 2014, p. 9.

* cited by examiner

PHOTOSENSITIVE POLYIMIDE COMPOSITIONS

CROSS REFERENCE TO RELATED APPLICATIONS

This application is a divisional of U.S. application Ser. No. 16/809,566, filed Mar. 5, 2020, now pending, which claims the benefit of U.S. Provisional Application No. 62/813,940, filed Mar. 5, 2019, which is incorporated herein by reference in its entirety.

BACKGROUND OF THE INVENTION

Field of the Invention

The present invention relates to photosensitive polyimide compositions. More specifically, the present invention relates to photosensitive compositions containing a series of polyimides and reactive end group capped polyimides. Even more specifically, the photosensitive compositions as described herein contain a mixture of either a soluble polyimide or a suitably end capped polyimide in combination with at least one photoacid generator, at least one photo radical generator, and one or more crosslinking agents. The compositions of this invention are useful for forming microelectronic and/or optoelectronic devices and assemblies thereof, and more specifically, such compositions exhibit improved thermal, mechanical and opto-electronic properties.

Description of the Art

Organic polymer materials are increasingly being used in the microelectronics and optoelectronics industries for a variety of applications. For example, the uses for such organic polymer materials include permanent interlevel dielectrics, redistribution layers (RDL), stress buffer layers, chip stacking and/or bonding, leveling or planarization layers, alpha-particle barriers, passivation layers, among others, in the fabrication of a variety of microelectronic and optoelectronic devices. Where such organic polymer materials are photosensitive, thus self-imageable, and therefore, offer additional advantage of reducing the number of processing steps required for the use of such layers and structures made therefrom. Additionally, such organic polymer materials enable the direct adhesive bonding of devices and device components to form various structures. Such devices include microelectromechanical systems (MEMS), microoptoelectromechanical systems (MOEMS) and the semiconductor device encompassing a complementary metal oxide semiconductor (CMOS) image sensor dam structure, and the like.

There has been innumerable polymeric materials used in the art in order to achieve the above noted desired requirements. One such class of polymers include polyimides and its precursor, polyamic acid. However, most of the polyimides disclosed in the art are generally for positive tone image forming films, and many not be suitable for many applications. Some of the drawbacks include use of highly toxic and corrosive phenolic monomers which provide alkali solubility that is required for forming positive tone compositions. Other property disadvantages include insolubility of the polyimides and/or the precursor polyamic acids in commonly used solvents in the electronic industry, poor photo imaging capabilities, among others. Even more importantly, such compositions suffer from poor thermo-mechanical properties and may require high cure temperatures, often times higher than 300° C., which are undesirable. See for example, U.S. Pat. No. 8,946,852 B2 and U.S. Pat. No. 7,485,405 B2.

Accordingly, it is an object of this invention to provide photosensitive polyimide compositions that provide improved thermo-mechanical properties.

It is also an object of this invention to provide compositions which can be cured at lower temperature that exhibit improved thermo-mechanical properties.

Other objects and further scope of the applicability of the present invention will become apparent from the detailed description that follows.

SUMMARY OF THE INVENTION

Surprisingly, it has now been found that various polyimides that are soluble in commonly used organic solvents can be used in forming photosensitive compositions as described herein that provide hitherto unattainable thermo-mechanical properties. More specifically, the photosensitive compositions as described herein contain a mixture of either a soluble polyimide or a suitably end capped polyimide in combination with at least one photoacid generator, at least one photo radical generator, and one or more crosslinking agents. The end capped polyimides as employed in the composition of this invention can be made by either end capping the amino end group of the polyimide with a suitable mono-anhydride or by end capping the anhydride end group of the polyimide with a suitable mono-amine. The photosensitive compositions of this invention feature excellent thermo-mechanical properties and can be cured at temperatures lower than 200° C.

BRIEF DESCRIPTION OF THE DRAWINGS

Embodiments in accordance with the present invention are described below with reference to the following accompanying figures and/or images. Where drawings are provided, it will be drawings which are simplified portions of various embodiments of this invention and are provided for illustrative purposes only.

DETAILED DESCRIPTION OF THE INVENTION

Figure 1:
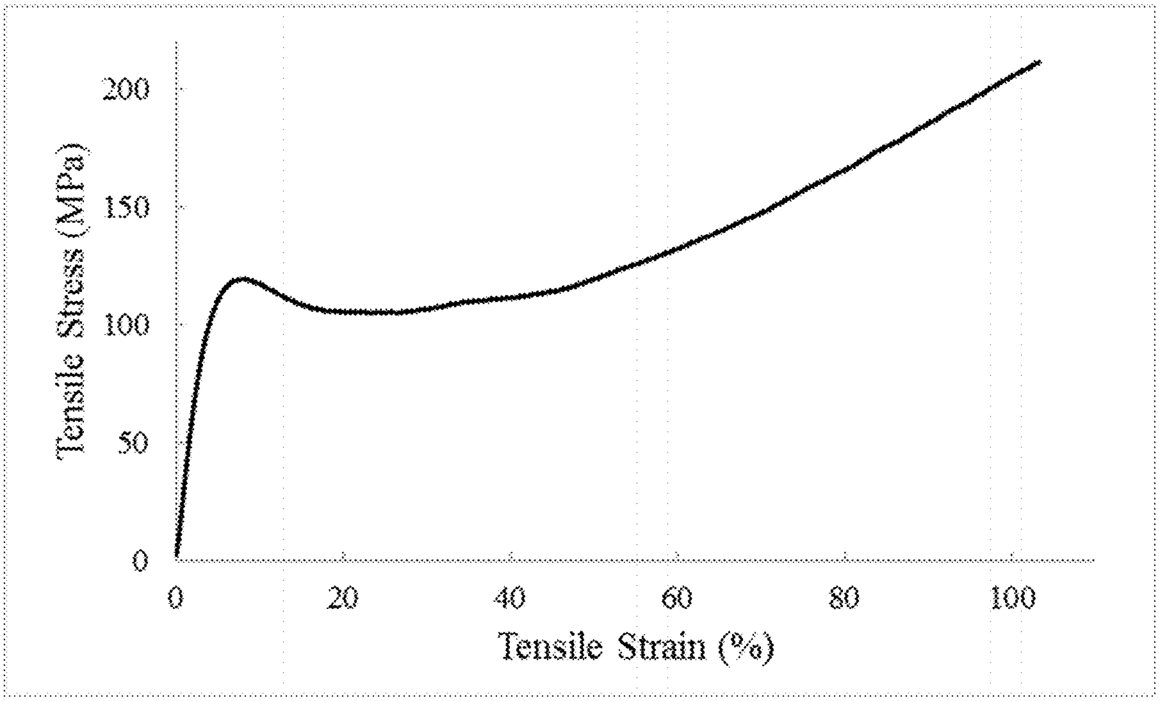
FIG. 1 shows a stress-strain curve of a composition embodiment of this invention.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the expression "alkyl" means a saturated, straight-chain or branched-chain hydrocarbon substituent having the specified number of carbon atoms. Particular alkyl groups are methyl, ethyl, n-propyl, isopropyl, tert-butyl, and so on. Derived expressions such as "alkoxy", "thioalkyl", "alkoxyalkyl", "hydroxyalkyl", "alkylcarbonyl", "alkoxycarbonylalkyl", "alkoxycarbonyl", "diphenylalkyl", "phenylalkyl", "phenylcarboxyalkyl" and "phenoxyalkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "perhaloalkyl" represents the alkyl, as defined above, wherein all of the hydrogen atoms in said alkyl group are replaced with halogen atoms selected from fluorine, chlorine, bromine or iodine. Illustrative examples include trifluoromethyl, trichloromethyl, tribromomethyl, triiodomethyl, pentafluoroethyl, pentachloroethyl, pentabromoethyl, pentaiodoethyl, and straight-chained or branched heptafluoropropyl, heptachloropropyl, heptabromopropyl, nonafluorobutyl, nonachlorobutyl, undecafluoropentyl, undecachloropentyl, tridecafluorohexyl, tridecachlorohexyl, and the like. Derived expression, "perhaloalkoxy", is to be construed accordingly. It should further be noted that certain of the alkyl groups as described herein, such as for example, "alkyl" may partially be fluorinated, that is, only portions of the hydrogen atoms in said alkyl group are replaced with fluorine atoms and shall be construed accordingly.

As used herein the expression "acyl" shall have the same meaning as "alkanoyl", which can also be represented structurally as "R—CO—," where R is an "alkyl" as defined herein having the specified number of carbon atoms. Additionally, "alkylcarbonyl" shall mean same as "acyl" as defined herein. Specifically, "$(C_1-C_4)$acyl" shall mean formyl, acetyl or ethanoyl, propanoyl, n-butanoyl, etc. Derived expressions such as "acyloxy" and "acyloxyalkyl" are to be construed accordingly.

As used herein, the expression "aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art.

As used herein, the expression "arylalkyl" means that the aryl as defined herein is further attached to alkyl as defined herein. Representative examples include benzyl, phenylethyl, 2-phenylpropyl, 1-naphthylmethyl, 2-naphthylmethyl and the like.

As used herein, the expression "alkenyl" means a non-cyclic, straight or branched hydrocarbon chain having the specified number of carbon atoms and containing at least one carbon-carbon double bond, and includes ethenyl and straight-chained or branched propenyl, butenyl, pentenyl, hexenyl, and the like. Derived expression, "arylalkenyl" and five membered or six membered "heteroarylalkenyl" is to be construed accordingly. Illustrative examples of such derived expressions include furan-2-ethenyl, phenylethenyl, 4-methoxyphenylethenyl, and the like.

As used herein, the expression "heteroaryl" includes all of the known heteroatom containing aromatic radicals. Representative 5-membered heteroaryl radicals include furanyl, thienyl or thiophenyl, pyrrolyl, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1]hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, $—CO_2H$, an ester, an amide, $(C_1-C_6)$alkoxy, $(C_1-C_6)$thioalkyl and $(C_1-C_6)$perfluoroalkoxy. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

It will be understood that the terms "dielectric" and "insulating" are used interchangeably herein. Thus reference to an insulating material or layer is inclusive of a dielectric material or layer and vice versa.

It will be understood that, as used herein, the phrase "microelectronic device" is inclusive of a "micro-optoelectronic device" and an "optoelectronic device". Thus, reference to microelectronic devices or a microelectronic device assemblies are inclusive of optoelectronic devices and micro-optoelectronic devices as well as assemblies thereof.

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile low-K structure.

As used herein, the terms "polymer composition," "copolymer composition," "terpolymer composition" or "tetrapolymer composition" are used herein interchangeably and are meant to include at least one synthesized polymer, copolymer, terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent (s), antioxidant(s), photoinitiator(s), sensitizers and other materials as will be discussed more fully below.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

The term "photodefinable" refers to the characteristic of a material or composition of materials, such as a polymer or polymer composition in accordance with embodiments of the present invention, to be formed into, in and of itself, a patterned layer or a structure. In alternate language, a "photodefinable layer" does not require the use of another material layer formed thereover, for example, a photoresist layer, to form the aforementioned patterned layer or structure. It will be further understood that a polymer composition having such a characteristic is generally employed in a pattern forming scheme to form a patterned film/layer or structure. It will be noted that such a scheme incorporates an "imagewise exposure" of the photodefinable material or layer formed therefrom. Such imagewise exposure being taken to mean an exposure to actinic radiation of selected portions of the layer, where non-selected portions are protected from such exposure to actinic radiation.

As used herein, the term "self-imageable compositions" will be understood to mean a material that is photodefinable and can thus provide patterned layers and/or structures after direct image-wise exposure of a film formed thereof followed by development of such images in the film using an appropriate developer.

By the term "derived" is meant that the polymeric repeating units are formed from, for example, condensation of a dianhydride with a diamine. That is, polyimide repeat units are derived from the corresponding dianhydride and diamine. Generally, such condensation reaction first results in a polyamic acid which is further condensed to form a polyimide as described further in detail below. Accordingly, a polyamic acid or a polyimide is generally derived from the condensation of equimolar amounts of at least one dianhydride with one diamine. When a mono-anhydride or a mono-amine is used off-setting the stoichiometry, the resulting polyimide will be end-capped with such excess amount of either the mono-anhydride or the mono-amine employed.

Thus, in accordance with the practice of this invention there is provided a photosensitive composition comprising:

a) a polyimide of the formula (I):

(I)

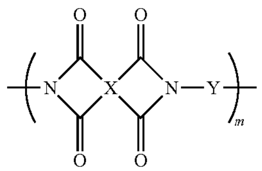

wherein:

m is an integer of at least 50;

X is one or more distinct tetravalent organic group; and

Y is one or more distinct divalent organic group;

b) a photo radical generator;

c) a photo acid generator; and d) one or more crosslinking agents.

Any of the polyimides known in the art can be used in the composition of this invention provided that it is soluble in commonly used organic solvents in the microelectronic industry as further described in detail below. In some embodiments of this invention, the polyimide used in the composition of this invention is an end-capped polyimide.

Any of the end-capped polyimides which are soluble in organic solvents can be employed in the composition of this invention. The end-capped polyimides can either be amino group end-capped or an anhydride group end-capped. In order to end cap the amino group of the polyimide, it is reacted with a suitable mono-anhydride. Similarly, the terminal anhydride group of the polyimide can be end-capped by reacting with a suitable mono-amine. All such end capped polyimides can be employed in the composition of this invention.

Non-limiting examples of such end-capped polyimides which can be used in the composition of this invention may be selected from the group consisting of:

(IA)

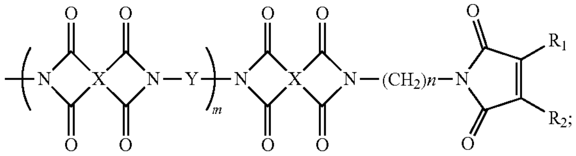

(IB)

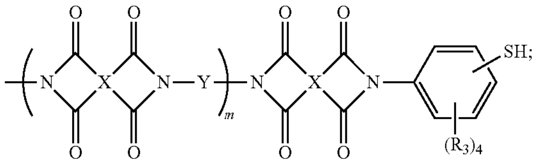

and (IC)

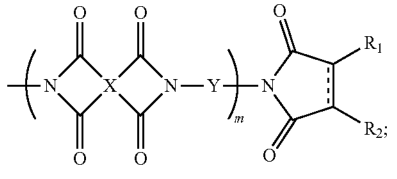

wherein

------ is a single bond or a double bond;

m is an integer of at least 50;

n is an integer from 1 to 12, inclusive;

X is one or more distinct tetravalent organic group; and

Y is one or more distinct divalent organic group;

$R_1$ and $R_2$ are the same or different and each independently of one another selected from the group consisting of hydrogen, linear or branched $(C_1-C_{16})$alkyl, linear or branched $(—C_1-C_{16})$alkenyl, hydroxy$(C_1-C_{12})$alkyl, perfluoro$(C_1-C_{12})$alkyl, hydroxy$(C_1-C_{12})$alkenyl, perfluoro$(C_1-C_{12})$alkenyl, $(C_6-C_{10})$aryl, $(C_6-C_{10})$aryl$(C_1-C_3)$alkyl and $(C_6-C_{10})$aryl$(C_1-C_3)$alkenyl; or $R_1$ and $R_2$ taken together with the carbon atoms to which they are attached to form a 5 to 7 membered monocyclic ring, a 6 to 12 membered bicyclic ring or a 9 to 14 membered tricyclic ring, said rings optionally containing one or more heteroatoms selected from O, N and S, and said rings optionally substituted with one or more groups selected from the group consisting of linear or branched $(C_1-C_5)$alkyl, $(C_6-C_{10})$aryl, halogen, hydroxy, linear or branched $(C_1-C_5)$alkoxy and $(C_6-C_{10})$aryloxy; and wherein one or more of hydrogens of $(CH_2)$ is replaced with a group selected from the group consisting of halogen, hydroxy, linear or branched $(C_1-C_{16})$alkyl, linear or branched hydroxy$(C_1-C_{12})$alkyl, linear or branched perfluoro$(C_1-C_{12})$alkyl, $(C_6-C_{10})$aryl and $(C_6-C_{10})$aryl$(C_1-C_3)$alkyl, linear or branched $(C_1-C_{16})$alkoxy and linear or branched perfluoro$(C_1-C_{12})$alkoxy; and each of $R_3$ is independently selected from the group consisting of hydrogen, halogen, hydroxy, methyl, ethyl, linear or branched $(C_3-C_6)$alkyl, trifluoromethyl, pentafluoroethyl, linear or branched perfluoro$(C_3-C_6)$alkyl, methoxy, ethoxy, linear or branched $(C_3-C_6)$alkyloxy, $(C_2-C_6)$acyl, $(C_2-C_6)$acyloxy, phenyl and phenoxy.

The polyimides as used herein can be synthesized by any of the procedures known to one skilled in the art. Such methods include condensation of one or more dianhydrides with one or more diamines essentially in equimolar ratios. Similarly, the end-capped polyimides can by prepared by employing a suitable mono-amine or a mono-anhydride. For example, aminoalkyl maleimide end-capped polyimide of formula (IA) can be prepared by using suitable amounts of substituted aminoalkyl maleimide of formula (II) is employed to end cap the resulting polyamic acid or polyimide as further discussed in detail below. Similarly other end-capped polyimides as used herein can be prepared by employing suitable mono-functional end capping agent, i.e., a mono-amine or a mono-anhydride. It should be noted that the total molar ratios of the dianhydrides and the diamines, including the mono-functional amine or anhydride is kept always equimolar so as to form a desirable molecular weight end-capped polyimide.

More specifically, the dianhydrides and the diamines that are suitable for forming the polyamic acid or polyimide of this invention can be represented by the following general formulae (ID) and (IE).

(ID)

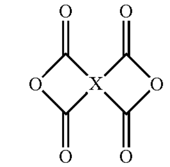

(IE)

$H_2N—Y—NH_2$

Wherein X and Y are as defined herein. Thus, any of the dianhydrides of tetracarboxylic acid in combination with any of the diamines can be employed to form the polyamic acid and subsequently the polyimides. Again, as noted, any of the techniques known in the art to make polyimides and/or polyamic acid can be employed herein in combination with desirable amounts of the end-capping agent, if needed.

Now turning specifically to X, any of the suitable tetravalent organic group can be employed herein. Non-limiting examples of such X may be selected from the group consisting of:

X-1

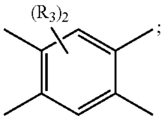

X-2

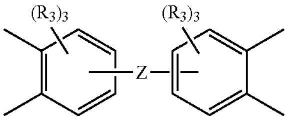

X-3

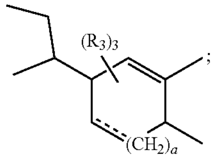

X-4

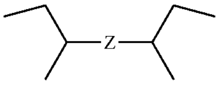

wherein a is an integer from 0 to 4, inclusive;

------ is a single bond or a double bond;

each of $R_3$ is independently selected from the group consisting of hydrogen, methyl, ethyl, linear or branched $(C_3-C_6)$alkyl, trifluoromethyl, pentafluoroethyl, linear or branched perfluoro$(C_3-C_6)$alkyl, methoxy, ethoxy, linear or branched $(C_3-C_6)$alkyloxy, $(C_2-C_6)$acyl, $(C_2-C_6)$acyloxy, phenyl and phenoxy;

Z is a divalent group selected from the group consisting of:

$(CR_4R_5)_b$, $O(CR_4R_5)_b$, $(CR_4R_5)_bO$, $(OCR_4R_5)_d$, $(CR_4R_5O)_d$, $(CR_4R_5)_b—O—(CR_4R_5)_c$, $(CR_4R_5)_b—O—(SiR_4R_5)_c$, $(CR_4R_5)_b—(CO)O—(CR_4R_5)_c$, $(CR_4R_5)_b—O(CO)—(CR_4R_5)_c$, $(CR_4R_5)_b—(CO)—(CR_4R_5)_c$, $(CR_4R_5)_b—(CO)NH—(CR_4R_5)_c$, $(CR_4R_5)_b—NH(CO)—(CR_4R_5)_c$, $(CR_4R_5)_b—NH—(CR_4R_5)_c$, where b and c are integers which may be the same or different and each independently is 0 to 12, and d is an integer from 1 to 12, inclusive;

$R_4$ and $R_5$ are the same or different and each independently selected from the group consisting of hydrogen, methyl, ethyl, linear or branched ($C_3$-$C_6$)alkyl, trifluoromethyl, pentafluoroethyl, linear or branched perfluoro($C_3$-$C_6$)alkyl, methoxy, ethoxy, linear or branched ($C_3$-$C_6$)alkyloxy, ($C_2$-$C_6$)acyl, ($C_2$-$C_6$)acyloxy, phenyl and phenoxy.

Even more specifically, suitable dianhydrides may include the following:

(X-1a)

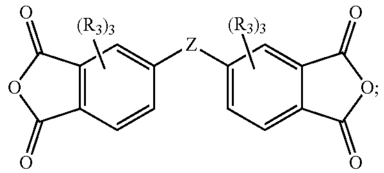

(X-1b)

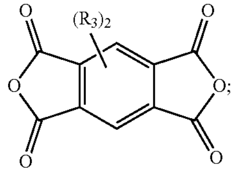

(X-1c)

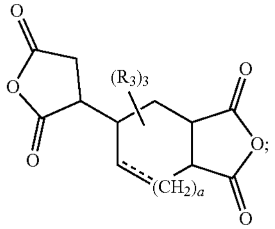

(X-1d)

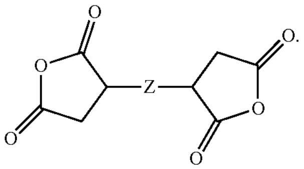

Even more specifically, one or more of the dianhydrides of the following formulae can also be employed herein.

In some embodiments, the polyimide or polyamic acid of this invention are formed using the dianhydrides where X is derived from one or more dianhydrides selected from the group consisting of:

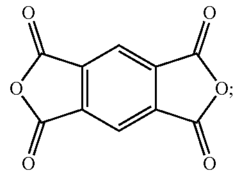

1H,3H-benzo[1,2-c:4,5-c′]difuran-1,3,5,7-tetraone (PMDA)

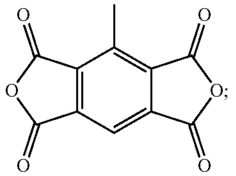

4-methyl-1H,3H-benzo[1,2-c:4,5-c′]difuran-1,3,5,7-tetraone

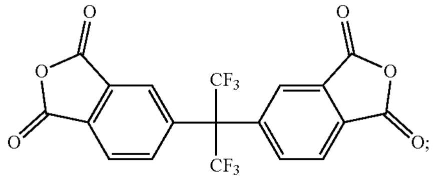

5,5′-(perfluoropropane-2,2-diyl)bis(isobenzofuran-1,3-dione) (6FDA)

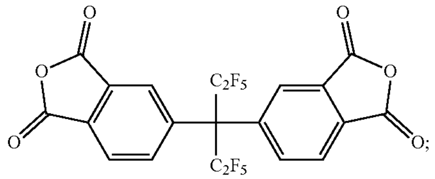

5,5′-(perfluoropentane-3,3-diyl)bis(isobenzofuran-1,3-dione)

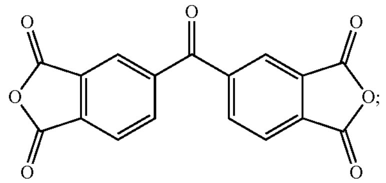

5,5′-carbonylbis(isobenzofuran-1,3-dione) (BTDA)

(X-1e)

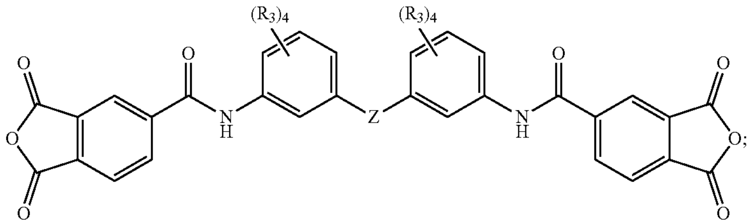

and (X-1f)

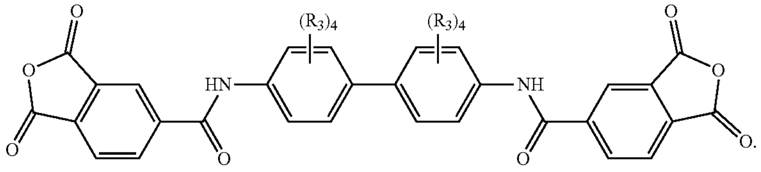

Where a, Z and $R_3$ are as defined herein.

-continued

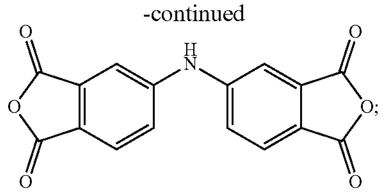

5,5′-azanediylbis(isobenzofuran-1,3-dione)

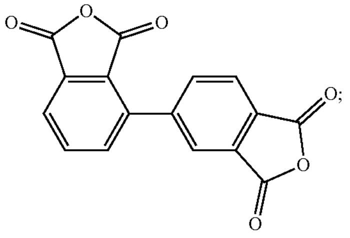

[4,5′-biisobenzofuran]-1,1′,3,3′-tetraone (α-BPDA)

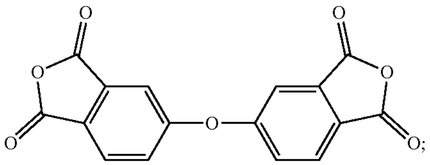

5,5′-oxybis(isobenzofuran-1,3-dione) (ODPA)

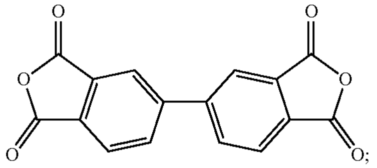

and

[5,5′-biisobenzofuran]-1,1′,3,3′-tetraone (BPDA)

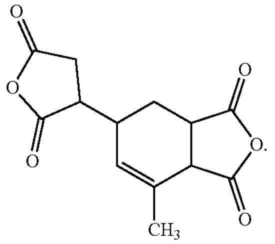

5-(2,5-dioxotetrahydrofuran-3-yl)-7-methyl-3a,4,5,7a-tetrahydroisobenzofuran-1,3-dione (D1901)

As noted, again, any of the diamines known in the art can be used to form the polyamide or polyamic acid of this invention. The diamines can again be broadly classified as aromatic diamines, aliphatic diamines or mixed aliphatic-aromatic diamines which contain a wide variety of bridging groups. A non-limiting generic types of diamines include the following:

(Y-1a)

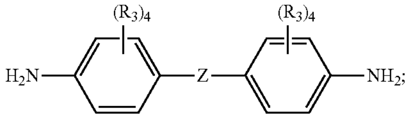

-continued (Y-1b)

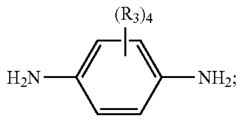

Where a, Z and $R_3$ are as defined herein.

In some embodiments, the polyimide or polyamic acid of this invention are formed using the diamines where Y is derived from one or more diamines selected from the group consisting of:

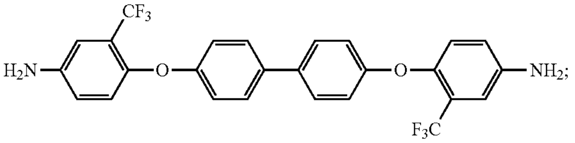

4,4′-([1,1′-biphenyl]-4,4′-diylbis(oxy))bis(3-(trifluoromethyl)aniline) (6BF)

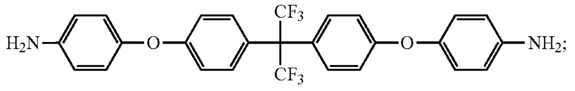

4,4′-(((perfluoropropane-2,2-diyl)bis(4,1-phenylene))bis(oxy))dianiline (HFBAPP)

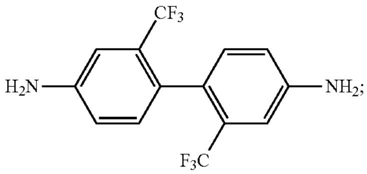

2,2′-bis(trifluoromethyl)-[1,1′-biphenyl]-4,4′-diamine (PFMB)

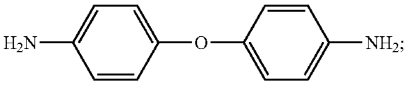

4,4′-oxydianiline (4,4′-ODA)

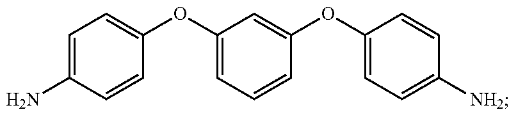

4,4′-(1,3-phenylenebis(oxy))dianiline (APB)

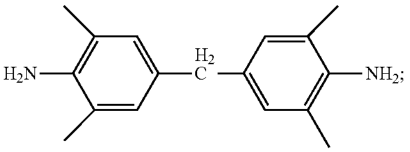

4,4′-methylenebis(2,6-dimethylaniline) (DO3)

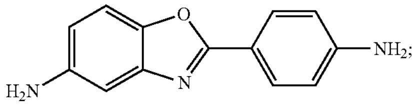

2-(4-aminophenyl)benzo[d]oxazol-5-amine (BZXPh-5)

-continued

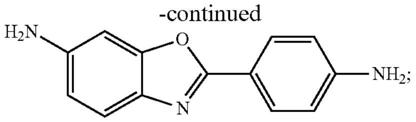

2-(4-aminophenyl)benzo[d]oxazol-6-amine (BZXPh-6)

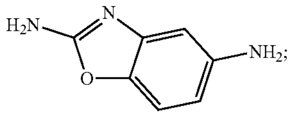

benzo[d]oxazole-2,5-diamine (BZX-5)

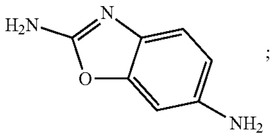

;

benzo[d]oxazole-2,6-diamine (BZX-6)

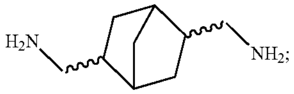

bicyclo[2.2.1]heptane-2,5-diyldimethanamine (NBDA) a diamine of formula (IIIA)

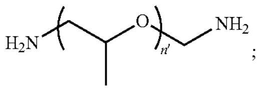

;

(IIIB) where n' = 2 to 6 (JD-230)

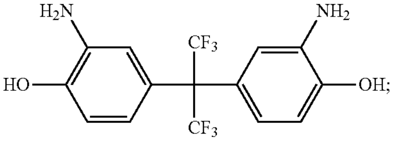

and 4,4'-(perfluoropropane-2,2-diyl)bis(2-aminophenol) (BAFA)

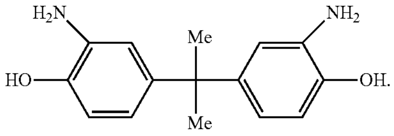

4,4'-(propane-2,2-diyl)bis(2-aminophenol) (DABPA)

As noted, in some embodiments, the end capped polyimide of this invention are end capped with a suitable alkylamino maleimide compound. A suitable end capped alkylamino maleimide group is derived from a compound of formula (II):

(II)

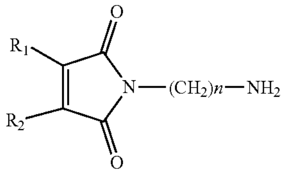

wherein n, $R_1$ and $R_2$ are as defined above.

The compounds of formula (II) can be readily prepared by any of the methods known in the art. For example, D. Roy, et al., Macromol. Rapid Commun. 2014, 35, 174-179, disclose a method for the preparation of a compound of formula (II), where n=2 and $R_1$ and $R_2$ are each methyl. Similar preparative methods can be used to make various other compounds of formula (II) by employing suitable starting materials as shown in Scheme I.

Scheme I

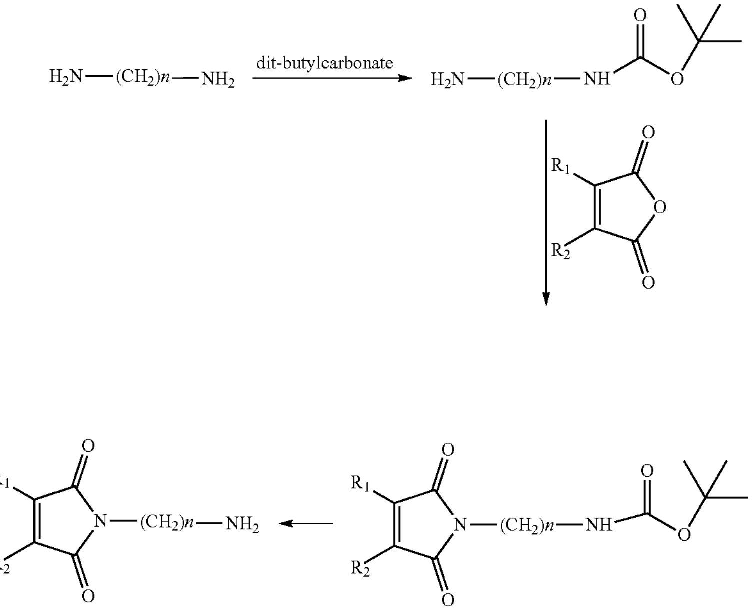

Again, any of the alkylamino maleimide compound of formula (II) that will bring about the intended benefit can be employed herein. Non-limiting examples of the compound of formula (II) is selected from the group consisting of:

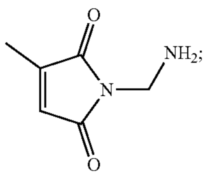

1-(aminomethyl)-3-methyl-1H-pyrrole-2,5-dione

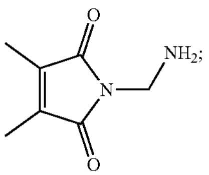

1-(aminomethyl)-3,4-dimethyl-1H-pyrrole-2,5-dione

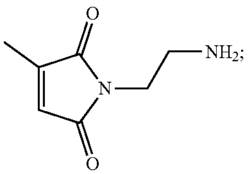

1-(2-aminoethyl)-3-methyl-1H-pyrrole-2,5-dione

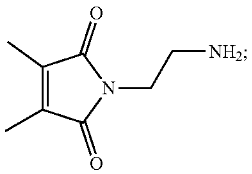

1-(2-aminoethyl)-3,4-dimethyl-1H-pyrrole-2,5-dione (DMMIEt—$NH_2$)

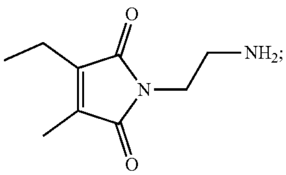 and 1-(2-aminoethyl)-3-ethyl-4-methyl-1H-pyrrole-2,5-dione

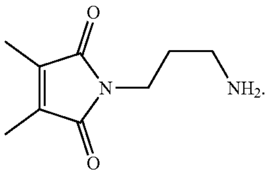

1-(3-aminopropyl)-3,4-dimethyl-1H-pyrrole-2,5-dione

In some embodiments, the composition of this invention contains a polyimide of the formula (IB), wherein at least one end of the main chain of the polyimide of formula (IB) is end capped with a compound of formula (IV):

(IV)

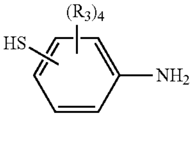

wherein $R_3$ is as defined above.

Non-limiting examples of the compound of formula (IV) may be selected from the group consisting of:

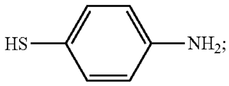

4-aminobenzenethiol

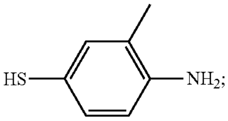

4-amino-3-methylbenzenethiol

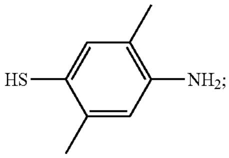

4-amino-2,5-dimethylbenzenethiol

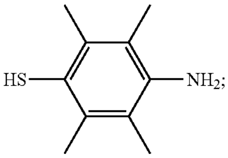

4-amino-2,3,5,6-tetramethylbenzenethiol

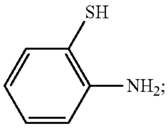

2-aminobenzenethiol ($2\text{-}NH_2PhSH$)

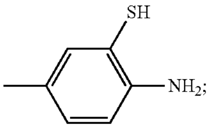

2-amino-5-methylbenzenethiol

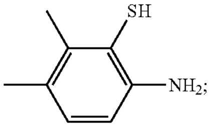

6-amino-2,3-dimethylbenzenethiol

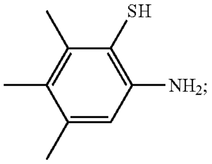 and 6-amino-2,3,4-trimethylbenzenethiol

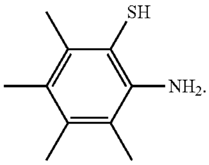

2-amino-3,4,5,6-tetramethylbenzenethiol

In some other embodiments, the composition of this invention contains a polyimide of the formula (IC), wherein at least one end of the main chain of the polyimide of formula (IC) is end capped with a compound of formula (V):

(V)

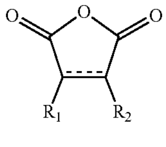

wherein ------ , $R_1$ and $R_2$ are as defined above.

Non-limiting examples of the compound of formula (V) are selected from the group consisting of:

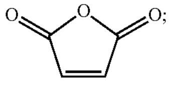

maleic anhydride (MA)

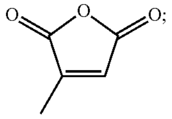

methylmaleic anhydride

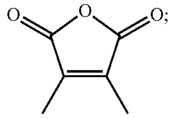

dimethylmaleic anhydride (DMMA)

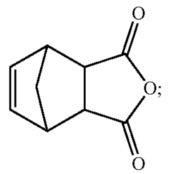

3a,4,7,7a-tetrahydro-4,7-methanoisobenzo-furan-1,3-dione (nadic anhydride)

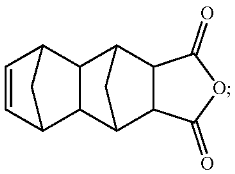

3a,4,4a,5,8,8a,9,9a-octahydro-4,9:5,8-dimethanonaphtho[2,3-c]furan-1,3-dione (TD-anhydride)

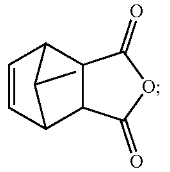

and

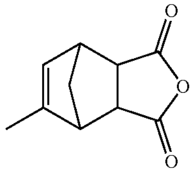

8-methyl-3a,4,7,7a-tetrahydro-4,7-methanoisobenzo-furan-1,3-dione 5-methyl-3a,4,7,7a-tetrahydro-4,7-methanoisobenzofuran-1,3-dione

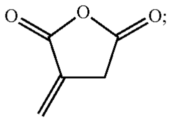

and

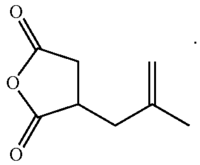

.

itaconic anhydride (IA)

3-(2-methylallyl)dihydrofuran-2,5-dione (MPSA)

The polyimide of this invention having suitable molecular weight can be tailored based on the intended application by employing appropriate polycondensation methods. Accordingly, in some embodiments the number of repeat units, m, in the resulting polyamic acid or the polyimide is at least 50; in some other embodiments m is at least 100, 500, 1000, 2000 or higher. In some embodiments m is from 50 to 2000, inclusive.

The degree of polycondensation can be measured by determining the molecular weight of the resulting polyamic acid or the polyimide using any of the known methods in the art, such as for example, by gel permeation chromatography (GPC) equipped with suitable detector and calibration standards, such as differential refractive index detector calibrated with narrow-distribution polystyrene standards.

Accordingly, the polyimide of this invention generally exhibit a weight average molecular weight ($M_w$) of at least about 5,000. In some other embodiments, the polyimide as employed in the composition of this invention exhibits a weight average molecular weight ($M_w$) of at least about 20,000.

In some other embodiments, the polyimide used in accordance of this invention has a $M_w$ of at least about 25,000. In yet another embodiment, the polyimide used in this invention has a $M_w$ of at least about 100,000. In some other embodiments, the polyimide used in this invention has a $M_w$ of at least about 200,000. In some other embodiments, the polyimide of this invention has a $M_w$ ranging from about 25,000 to 500,000, or higher.

The polyimide of this invention generally contains an imide repeat unit derived from at least one dianhydride and at least one diamine and if needed end capped with a suitable end-capping agent as described herein. In some other embodiments, the polyimide of this invention contains an imide repeat units derived from two or more anhydrides and one or more diamines as described herein, which is further end capped with the end capping agent, if needed, as described herein. All of such permutation and combinations are part of this invention. Generally, equimolar ratios of dianhydrides and diamines are employed to form the polyamic acid or the polyimide. That is, one mole of dianhydride is condensed with one mole of diamine. When two or more dianhydrides or diamines are employed, any of the molar ratios of the respective two or more dianhydrides and diamines can be employed so as to tailor the properties of the resulting polyamic acid or the polyimide and depending upon the intended applications. If end capping agent is used, the molar ratios are again adjusted so as to maintain equimolar ratios of total amine to total anhydride function.

Non-limiting examples of a polyamic acid or a polyimide made in accordance of this invention may be enumerated as follows:

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), and 2,2'-bis(trifluoromethyl)-[1,1'-biphenyl]-4,4'-diamine (PFMB).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and 1-(2-aminoethyl)-3,4-dimethyl-1H-pyrrole-2,5-dione (DMMIEt-$NH_2$).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 4,4'-methylenebis(2,6-dimethylaniline) (DO3) and 1-(2-aminoethyl)-3,4-dimethyl-1H-pyrrole-2,5-dione (DMMIEt-$NH_2$).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 4,4'-methylenebis(2,6-dimethylaniline) (DO3) and 2-aminobenzenethiol (2-$NH_2$PhSH).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and maleic anhydride (MA).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and dimethylmaleic anhydride (DMMA).

A polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and itaconic anhydride (IA).

Advantageously, the polyimides employed in the composition of this invention are soluble in an organic solvent. Exemplary organic solvents, without any limitation, that can be employed to dissolve the polyimide of this invention are selected from the group consisting of N-methyl-2-pyrrolidone (NMP), γ-butyrolactone (GBL), N,N-dimethylacetamide (DMAc), propylene glycol monomethyl ether acetate (PGMEA), dimethyl sulfoxide (DMSO), cyclopentanone, cyclohexanone, 2-butanone and 2-heptanone and mixtures in any combination thereof. As noted, any of the aforementioned solvents can be used alone or in combination with one or more solvents.

Advantageously the polyimides of this invention exhibit very high thermo-mechanical properties. Specifically, it has now been found that the films formed from the polyimides of this invention exhibit excellent tensile properties as well as very high elongation to break (ETB). The films can be readily formed from any of the known solvent casting methods as well as melt extrusion methods. For example, the polyamic acid or polyimide of this invention can be coated onto a suitable substrate, such as for example, spin coating. The coated substrates are then baked to remove any residual solvents especially in the case of polyimide coated substrate. The polyamic acid coated substrates are further baked to form the polyimide at a suitable temperature. Such post apply baking (PAB) temperatures can range from about 100° C. to 150° C. for a sufficient length of time from about 2 minutes to 30 minutes. In some embodiments such PAB temperature is at about 110° C. for about 3 minutes. The polyamic acid films so formed are then cured at a temperature in the range of from about 280° C. to 350° C. to form the polyimide films for a sufficient length of time ranging from about 2 hours to 4 hours under inert atmosphere, such as for example, nitrogen atmosphere. In some embodiments such curing is carried out at 320° C. for about 3 hours. The cured films can readily be lifted out of the substrates for mechanical property testing. The tensile strength of the so formed films are generally in the range from about 100 MPa to about 250 MPa depending upon the type of dianhydrides and diamines employed to form the polyimide. In some embodiments the tensile strength is from about 150 MPa to about 200 MPa and in some other embodiments the tensile strength is from about 160 MPa to about 180 MPa. The ETB of the films are generally high as well. The ETB can range from about 30 percent to 100 percent or higher. In some embodiments the ETB ranges from about 40 percent to 90 percent, 50 percent to 80 percent, and so on.

As noted the composition of this invention encompasses a photo radical generator. Any of the photo radical generators that would provide the intended benefit can be employed. That is, the radicals generated by the photo radical generator will cause the photo radical crosslinking of the polyimides of this invention with various ingredients used in the composition of this invention so as to form polymeric layers. In some embodiments, the composition of this invention encompasses a photo radical generator selected from the group consisting of:

a compound of formula (VI):

(VI)

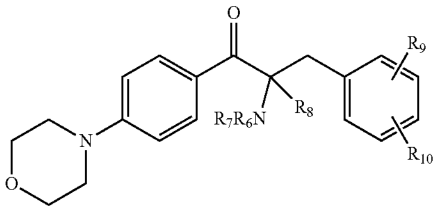

wherein $R_6$ and $R_7$ are the same or different and each independently of one another selected from the group consisting of hydrogen, linear or branched $(C_1\text{-}C_8)$alkyl and $(C_6\text{-}C_{10})$aryl, or $R_6$ and $R_7$ taken together with the nitrogen atom to which they are attached to form a 5 to 7 membered monocyclic ring or 6 to 12 membered bicyclic ring, said ring optionally containing one or more heteroatoms selected from O and N, and said ring optionally substituted with a group selected from the group consisting of linear or branched $(C_1\text{-}C_8)$alkyl, $(C_6\text{-}C_{10})$aryl, halogen, hydroxy, linear or branched $(C_1\text{-}C_5)$alkoxy and $(C_6\text{-}C_{10})$aryloxy; and $R_8$, $R_9$ and $R_{10}$ are the same or different and each independently of one another is selected from the group consisting of hydrogen, linear or branched $(C_1\text{-}C_{16})$ alkyl, $(C_6\text{-}C_{10})$aryl, $(C_6\text{-}C_{10})$aryl$(C_1\text{-}C_3)$alkyl, hydroxy, halogen, linear or branched $(C_1\text{-}C_{12})$alkoxy and $(C_6\text{-}C_{10})$aryloxy; and a compound of formula (VII):

(VII)

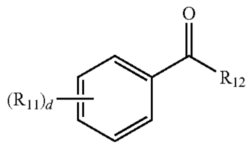

wherein d is an integer from 0 to 3, inclusive;

$R_{11}$ is selected from the group consisting of hydrogen, linear or branched $(C_1\text{-}C_{16})$alkyl, $(C_6\text{-}C_{10})$aryl, $(C_6\text{-}C_{10})$aryl$(C_1\text{-}C_3)$alkyl, hydroxy, halogen, linear or branched $(C_1\text{-}C_{12})$alkoxy and $(C_6\text{-}C_{10})$aryloxy;

$R_{12}$ is selected from the group consisting of linear or branched $(C_1\text{-}C_{16})$alkyl, $(C_3\text{-}C_8)$cycloalkyl, $(C_6\text{-}C_{10})$ aryl, $(C_6\text{-}C_{10})$aryl$(C_1\text{-}C_3)$alkyl, $(C_6\text{-}C_{10})$aryl$(C_1\text{-}C_6)$alkylphosphinate, $(C_6\text{-}C_{10})$heterocycle$(C_1\text{-}C_3)$alkyl, a group of formula $C(O)—(OCH_2CH_2)_e—OC(O)C(O)(C_6\text{-}C_{10})$aryl, where e is an integer from 2 to 4, inclusive, $C(O)C(O)O(C_1\text{-}C_3)$alkyl and a group of formula (C):

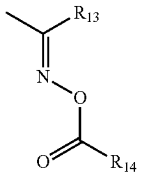

wherein $R_{13}$ is linear or branched ($C_1$-$C_{16}$)alkyl; and $R_{14}$ is ($C_6$-$C_{10}$)aryl;

and where each of said alkyl, cycloalkyl, aryl and heterocycle may additionally be substituted with one or more groups selected from the group consisting of hydroxy, linear or branched ($C_1$-$C_6$)alkyl, linear or branched ($C_1$-$C_6$)alkoxy and linear or branched thio ($C_1$-$C_6$)alkyl.

Non-limiting examples of the photo radical generator are enumerated as follows:

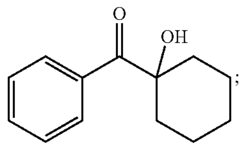

(1-hydroxycyclohexyl)(phenyl)methanone (commercially available as IRGACURE 184 from Ciba Specialty Chemicals)

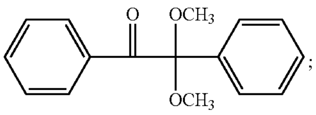

2,2-dimethoxy-1,2-diphenylethan-1-one (commercially available as IRGACURE 651 from Ciba Specialty Chemicals)

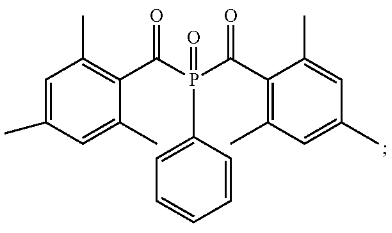

(phenylphosphoryl)bis(mesitylmethanone) (commercially available as IRGACURE 819 from Ciba Specialty Chemicals)

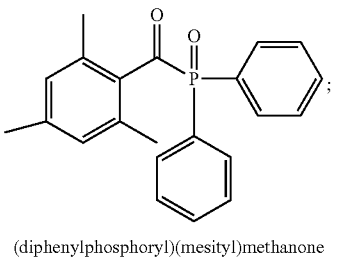

(diphenylphosphoryl)(mesityl)methanone (commercially available as DAROCUR TPO from Ciba Specialty Chemicals)

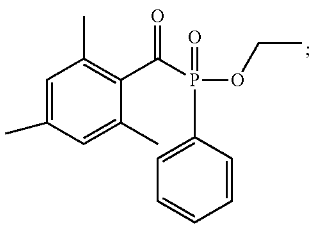

ethyl phenyl(2,4,6-trimethylbenzoyl)phosphinate (commercially available as OMNIRAD TPO L from IGM Resins)

-continued

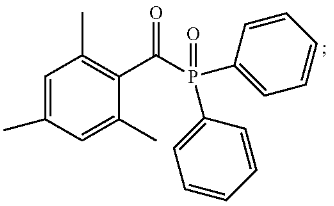

(diphenylphosphoryl)(mesityl)methanone

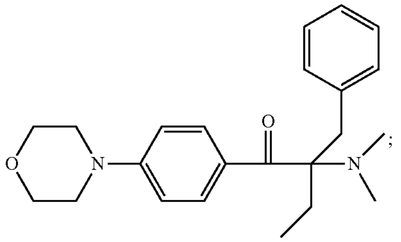

2-benzyl-2-(dimethylamino)-1-(4-morpholinophenyl)butan-1-one (commercially available as Irgacure 369 from Ciba Specialty Chemicals)

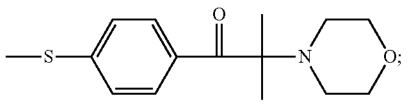

2-methyl-1-(4-(methylthio)phenyl)-2-morpholinopropan-1-one (commercially available as Irgacure 907 from Ciba Specialty Chemicals)

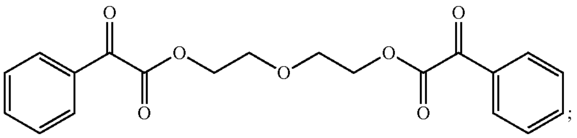

oxybis(ethane-2,1-diyl) bis(2-oxo-2-phenylacetate) (commercially available as Irgacure 754 from Ciba Specialty Chemicals)

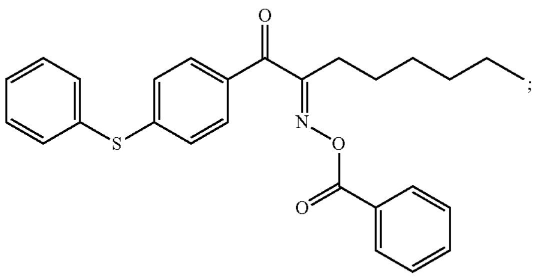

2-((benzoyloxy)imino)-1-(4-(phenylthio)phenyl)octan-1-one (commercially available as Irgacure OXE01 from Ciba Specialty Chemicals)

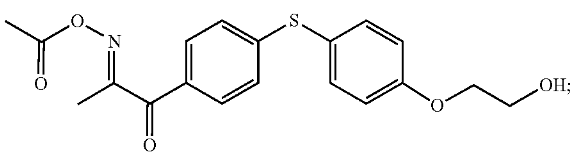

2-(acetoxyimino)-1-(4-((4-(2-hydroxyethoxy)phenyl)thio)phenyl) propan-1-one(commercially available as NCI 930 from Adeka)

-continued

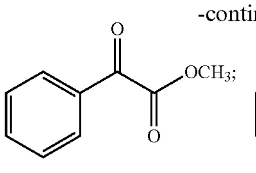

methyl 2-oxo-2-phenylacetate (commercially available as DAROCUR MBF from Ciba Specialty Chemicals)

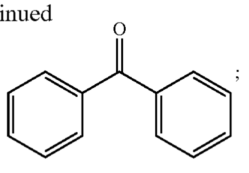

benzophenone (commercially available as DAROCUR BP from Ciba Specialty Chemicals)

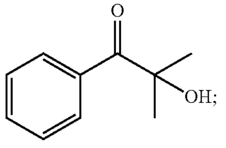

2-hydroxy-2-methyl-1-phenylpropan-1-one (commercially available as DAROCUR 1173 from Ciba Specialty Chemicals)

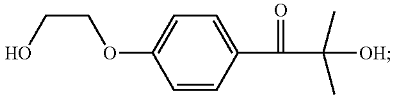

2-hydroxy-1-(4-(2-hydroxyethoxy)phenyl)-2-methylpropan-1-one (commercially available as Irgacure 2959 from Ciba Specialty Chemicals)

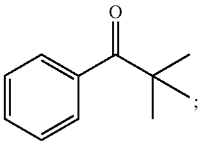

2,2-dimethyl-1-phenylpropan-1-one and a mixture in any combination thereof.

It should be noted that more than one photo radical generator can be employed so as to obtain beneficial effects. Accordingly, in some embodiments the composition of this invention contains two or more photo radical generators selected from the above list. Any of the suitable amounts of the photo radical generator can be employed in the composition of this invention which will bring about the intended effect. Generally, such amounts may vary from about 0.5 parts per hundred parts resin (pphr) to about 10 pphr or higher. In some embodiments the amount of photo radical generator employed is from about 2 pphr to about 4 pphr.

Further, the composition of this invention encompasses a photoacid generator. Any of the photoacid generator that will bring about the intended effect can be employed herein. Generally, the photoacid generator is capable of generating acid upon irradiation with light at wavelength of from 200 nm to 600 nm, the generated acid functions as a catalyst for cross-linking, among other things such as curing of the polymeric layer. The composition of the present invention have a good compatibility with the acid generating agent and, therefore, various kinds of the photoacid generators can be employed. Non-limiting illustrative examples of the photoacid generating agent include onium salts, diazomethane derivatives, glyoxime derivatives, beta-ketosulfone derivatives, disulfone derivatives, nitrobenzylsulfonate derivatives, sulfonate derivatives, imidyl-sulfonate derivatives, oximesulfonate derivatives, iminosulfonate derivatives, triazine derivatives, and the like.

Specific examples of photoacid generators include without any limitation, (p-isopropylphenyl)(p-methylphenyl)-iodonium tetrakis(pentafluorophenyl) borate (DPI-TPFPB), available commercially under the trade name RHODORSIL™ Photoinitiator 2074 from Rhodia, Inc.; (2-(4-methoxynaphthalen-1-yl)-2-oxoethyl)dimethylsulfonium tetrakis(perfluorophenyl)borate (MNDS-TPFPB), available commercially under the trade name TAG 382 from Toyo Inc.; tris(4-tert-butyl)phenyl)sulfonium tetrakis-(pentafluorophenyl)borate (TTBPS-TPFPB); tris(4-tert-butyl)phenyl) sulfonium hexafluorophosphate (TTBPS-HFP); triphenylsulfonium triflate (TPS-Tf); triazine (TAZ-101); triphenylsulfonium hexafluoroantimonate (TPS-103); triphenylsulfonium bis(perfluoromethanesulfonyl) imide (TPS-N1); di-(p-t-butyl) phenyliodonium bis(perfluoromethanesulfonyl) imide (DTBPI-N1); potassium tris (trifluoromethanesulfonyl) methanide, commercially available from Synquest Laboratories; di-(p-t-butylphenyl) iodonium tris(trifluoromethanesulfonyl)methanide (DTBPI-$C_1$); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTBPI-Tf), diphenyliodonium trifluoromethanesulfonate, diphenyliodonium 1,1,2,2,3,3,4,4,4-nonafluorobutane-1-sulfonate; bis(4-(tert-butyl)phenyl)iodonium trifluoromethanesulfonate; and bis(4-(tert-butyl) phenyl)iodonium 1,1,2,2,3,3,4,4,4-nonafluorobutane-1-sulfonate; and combinations thereof.

In some embodiments the photoacid generator used in the composition of this invention is selected from the group consisting of:

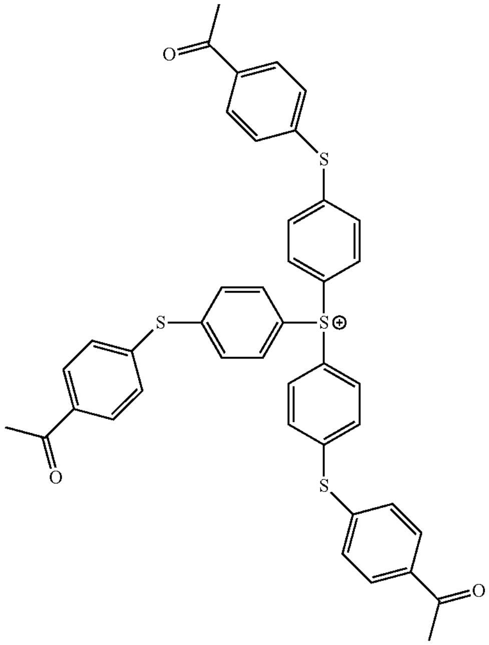

-continued

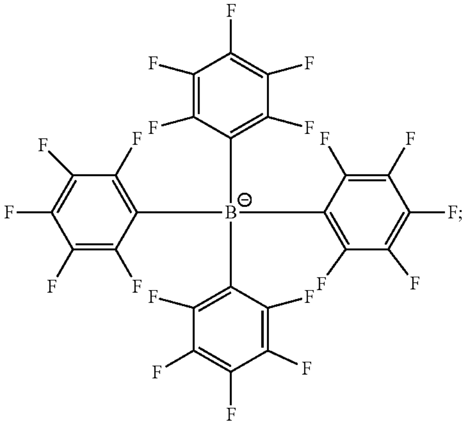

tris(4-((4-acetylphenyl)thio)phenyl)sulfonium tetrakis(perfluorophenyl)borate (Irgacure PAG 290, commercially available from BASF)

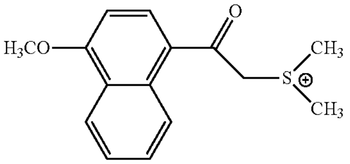

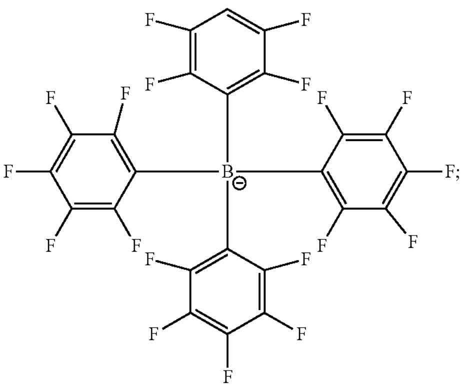

(2-(4-methoxynaphthalen-1-yl)-2-oxoethyl)dimethylsulfonium tetrakis(perfluorophenyl)borate -continued

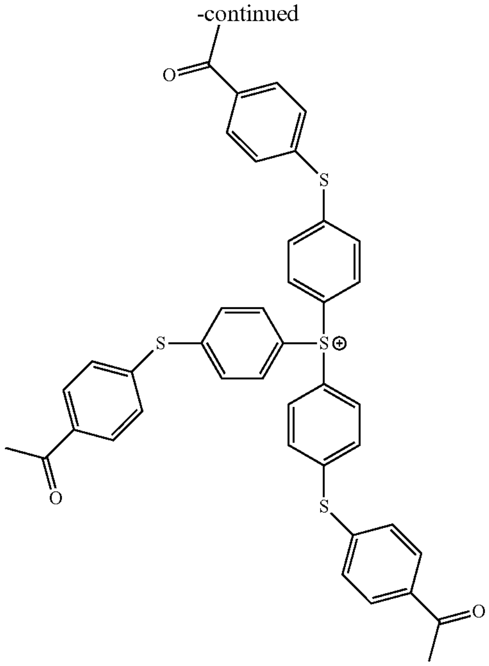

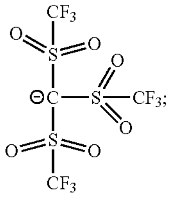

tris(4-((4-acetylphenyl)thio)phenyl)sulfonium tris((trifluoromethyl)sulfonyl)methanide

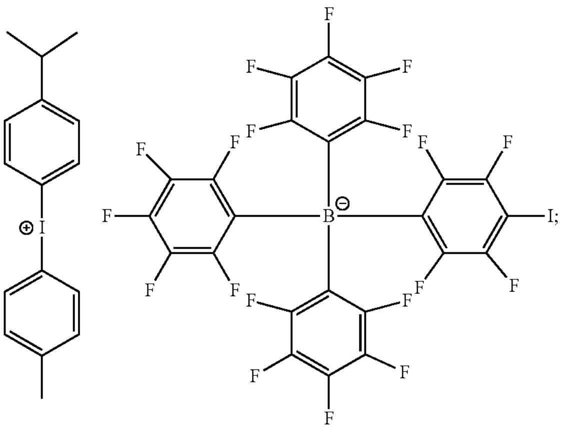

(4-methylphenyl)(4-isopropylphenyl)iodonium tetrakis(perfluorophenyl)borate (Rhodorsil 2074)

-continued

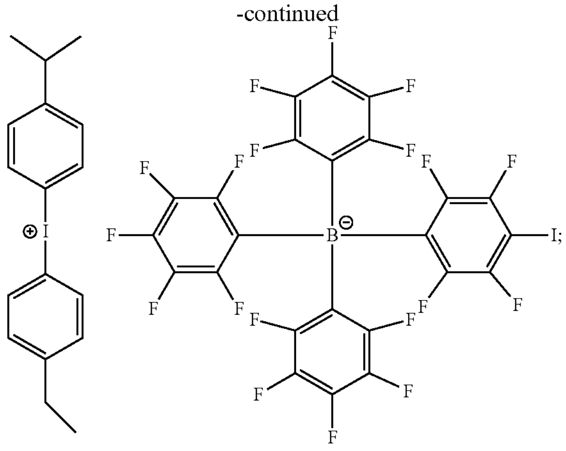

(4-ethylphenyl)(4-isopropylphenyl)iodonium tetrakis(perfluorophenyl)borate

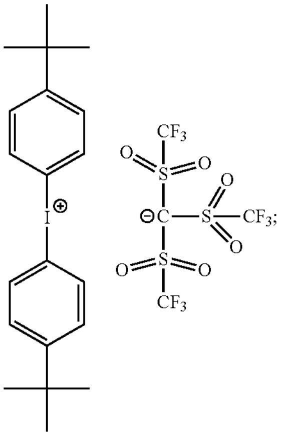

di-(p-t-butylphenyl)iodonium tris(trifluoromethane-sulfonyl)methanide

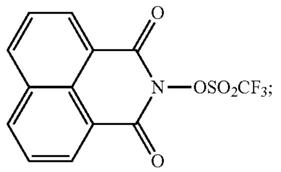

and 1,3-dioxo-1H-benzo[de]isoquinolin-2(3H)-yl trifluoromethanesulfonate

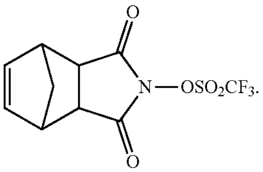

1,3-dioxo-1,3,3a,4,7,7a-hexahydro-2H-4,7-methanoisoindol-2-yl trifluoromethanesulfonate It should be noted that one or more of the above listed photoacid generators can be used as a mixture in any combination thereof. Any of the suitable amounts of the photoacid generator can be employed in the composition of this invention which will bring about the intended effect. Generally, such amounts may vary from about 3 parts per hundred parts resin (pphr) to about 20 pphr or higher. In some embodiments the amount of photo radical generator employed is from about 12 pphr to about 18 pphr.

It has been further observed that employing one or more photosensitizers in the composition of this invention provides additional beneficial effects. Most notably, the photosensitizers facilitate photo radical generation from the photo radical generator or the acid from the photoacid generator at a particular wavelength of the radiated light. For this purpose, any suitable sensitizer compound can be employed in the compositions of the present invention. Such suitable sensitizer compounds include, photosensitizers, such as, anthracenes, phenanthrenes, chrysenes, benzpyrenes, fluoranthenes, rubrenes, pyrenes, xanthones, indanthrenes, and mixtures thereof. In some exemplary embodiments, suitable sensitizer components include mixtures thereof. Generally, as mentioned above, the photosensitizers absorb energy from the radiated light source and transfers that energy to the photo radical generator of formulae (VI) or (VII) or the photoacid generator employed in the composition of this invention so as to generate the radicals or the acid to initiate the crosslinking. It has been now found that the photosensitizer as employed herein may itself act as a photo radical generator. Accordingly, in some embodiments, the composition of this invention contains only one or more photosensitizers in combination with one or more photo acid generator, which not only activates the composition at certain wavelength but also generates photo radical and an acid triggering the crosslinking. In some other embodiments the composition of this invention contains one or more photo radical generators of formulae (VI) or (VII) in combination with one or more photosensitizers of formula (VIII) and one or more photoacid generators as described hereinbelow.

Accordingly, the composition of this invention contains one or more of a photosensitizer of the formula (VIII):

(VIII)

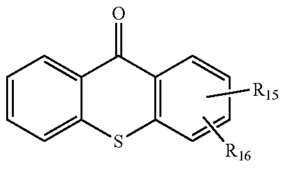

wherein $R_{15}$ and $R_{16}$ are the same or different and independently of each other selected from the group consisting of hydrogen, halogen, methyl, ethyl, linear or branched ($C_3$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_3$)alkyl, ($C_1$-$C_{12}$)alkoxy, ($C_3$-$C_{12}$)cycloalkoxy, ($C_6$-$C_{12}$)bicycloalkoxy, ($C_7$-$C_{14}$)tricycloalkoxy, ($C_6$-$C_{10}$)aryloxy($C_1$-$C_3$)alkyl and ($C_6$-$C_{10}$)-aryloxy.

Non-limiting examples of suitable one or more photosensitizers may be selected from the group consisting of:

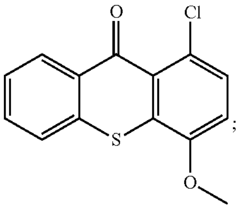

;

1-chloro-4-methoxy-9H-thioxanthen-9-one

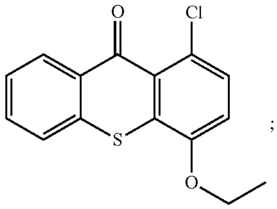

;

1-chloro-4-ethoxy-9H-thioxanthen-9-one

-continued

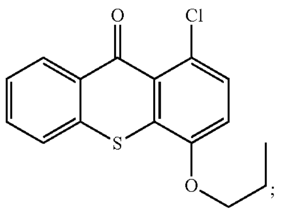

1-chloro-4-propoxy-9H-thioxanthen-9-one (commercially available as CPTX from IGM resins)

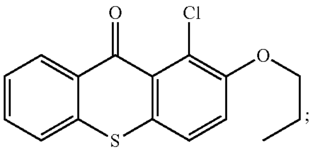

1-chloro-2-propoxy-9H-thioxanthen-9-one

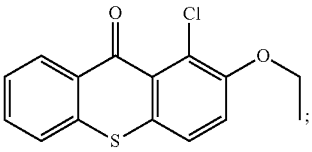

1-chloro-2-ethoxy-9H-thioxanthen-9-one

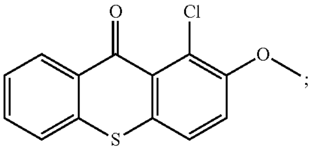

1-chloro-2-methoxy-9H-thioxanthen-9-one

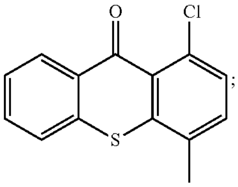

1-chloro-4-methyl-9H-thioxanthen-9-one

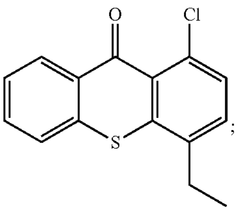

1-chloro-4-ethyl-9H-thioxanthen-9-one

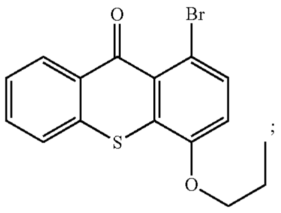

1-bromo-4-propoxy-9H-thioxanthen-9-one

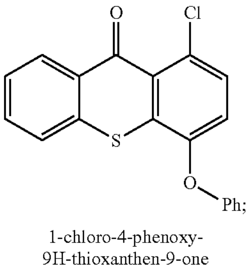

1-chloro-4-phenoxy-9H-thioxanthen-9-one

-continued

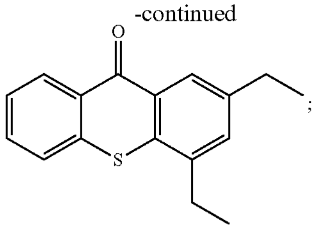

and 2,4-diethyl-9H-thioxanthen-9-one (commercially available as OMNIRAD DETX from IGM resins)

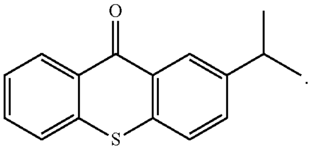

2-isopropyl-9H-thioxanthen-9-one (commercially available as OMNIRAD ITX from IGM resins)

It should again be noted that any one of these compounds can be used as photosensitizers alone or as mixtures in any combination thereof, and only if needed depending upon the intended use and to obtain the desirable benefit. Again, any amount of one or more of aforementioned sensitizers can be used in the composition of this invention so as to bring about the desired results. Generally it has now been found that such amounts can range from 0.5 to 5 parts per hundred parts of the polymer resin (pphr). In some embodiments such amounts range from 1 to 3 pphr.

The compositions of the present invention also include one or more crosslinking agents that are advantageously capable of bonding with the polyimide especially the end-capped polyimides such as the maleimide group or the thiol end group or any other functional group available in the polymeric chain for further crosslinking. Such materials include, but are not limited to, crosslinking compounds that incorporate one or more epoxy groups such as a glycidyl group, an epoxycyclohexyl group, an oxetane group; an oxazoline group such as 2-oxazoline-2-yl group, a methylol group such as a N-hydroxy methylaminocarbonyl group or an alkoxymethyl group such as a N-methoxy methylaminocarbonyl group, acrylate group, thiol or thioalkyl group, maleimide, and the like. Generally, the aforementioned bonding with the end group or other functional group available in the polyimide is a cross-linking reaction that is initiated by photo radical generated during the photo-irradiation at an appropriate temperature, and further facilitated by the photoacid generated by the photoacid generator. Further, such crosslinking can be completed further by curing at an appropriate temperature post irradiation, generally at or above 150° C. for an appropriate amount of time. It should be noted however that it is surprising that such curing of the composition of this invention can be carried out at much lower temperature than conventionally used for polyimides know in the art, which is generally carried out at higher than 250° C. or even higher than 300° C.

Accordingly, in some embodiments of this invention, the photosensitive composition of this invention, without any limitation, contains one or more crosslinking agents selected from the following:

an epoxy acrylate;

a polyester acrylate;

a polyether acrylate;

an aliphatic urethane acrylate;

an aromatic urethane acrylate;

a multifunctional epoxy; and a multifunctional mercapto($C_2$-$C_8$)alkanoate;

Exemplary crosslinking agents that may be employed in the composition of this invention without any limitation may be selected from the group consisting of:

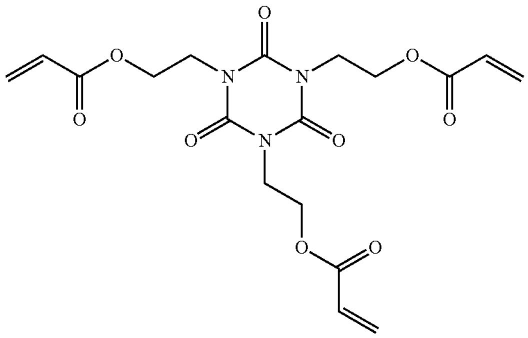

;

(2,4,6-trioxo-1,3,5-triazinane-1,3,5-triyl)tris(ethane-2,1-diyl) triacrylate (TAEICY)

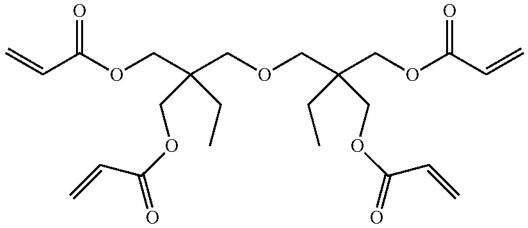

;

(oxybis(methylene))bis(2-ethylpropane-2,1,3-triyl) tetraacrylate (BTMPTA)

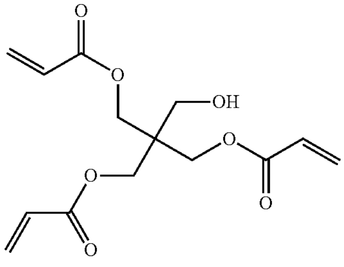

;

2-((acryloyloxy)methyl)-2-(hydroxymethyl)-propane-1,3-diyl diacrylate (A-TMM available from Aldrich)

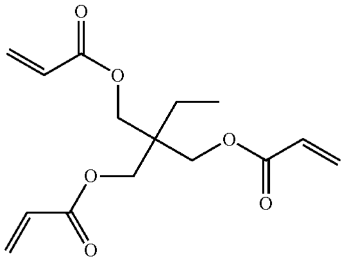

;

2-((acryloyloxy)methyl)-2-ethylpropane-1,3-diyl diacrylate (Propyl Tri-acrylate from Aldrich)

-continued

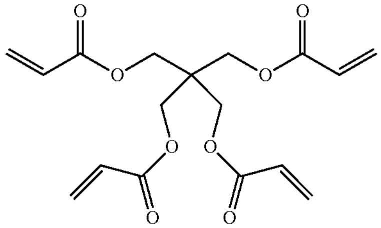

;

2,2-bis((acryloyloxy)methyl)propane-1,3-diyl diacrylate (PETetA from Aldrich)

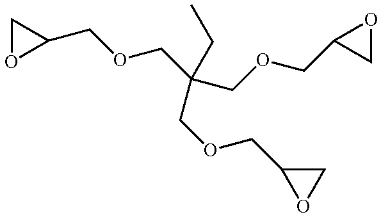

;

2,2′-(((2-ethyl-2-((oxiran-2-ylmethoxy)methyl)-propane-1,3-diyl)bis(oxy))bis(methylene))-bis(oxirane) (TMPTGE, from Nagase)

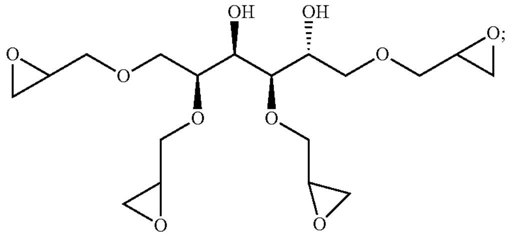

(2R,3R,4R,5S)-1,3,5,6-tetrakis(oxiran-2-ylmethoxy)hexane-2,4-diol (also known as tetrakis-o-(oxiranylmethyl)-D-glucitol) (Denacol EX-614B from Nagase)

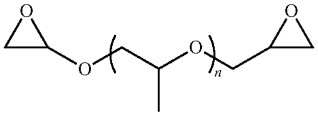

;

where *n* is an integer from 3 to 6 propylene glycol diglycidyl ether (Denacol EX 946L from Nagase)

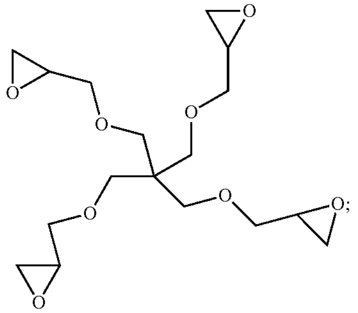

2,2′-(((2-bis((oxiran-2-ylmethoxy)methyl)-propane-1,3-diyl)bis(oxy))bis(methylene))-bis(oxirane) (PEGE from Alfa)

-continued

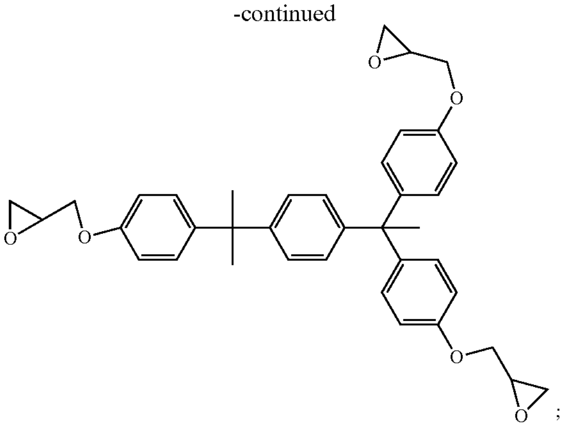

2,2′-((((1-(4-(2-(4-(oxiran-2-ylmethoxy)phenyl)propan-2-yl)phenyl)ethane-1,1-diyl)bis(4,1-phenylene))bis(oxy))-bis(methylene))bis(oxirane) (VG3101L from Techmore)

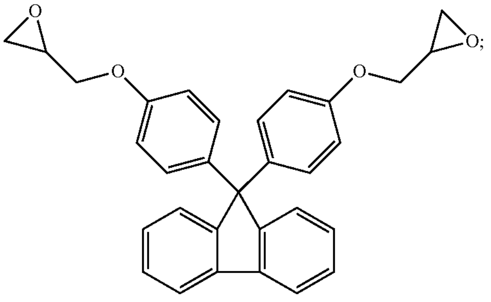

2,2′-((((9H-fluorene-9,9-diyl)bis(4,1-phenylene))bis(oxy))-bis(methylene))bis(oxirane) (CardoEpoxy from Combi Blocks)

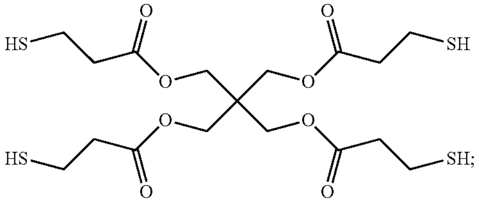

and 2,2-bis(((3-mercaptopropanoyl)oxy)methyl)propane-1,3-diyl bis(3-mercaptopropanoate) (PET3MP)

-continued

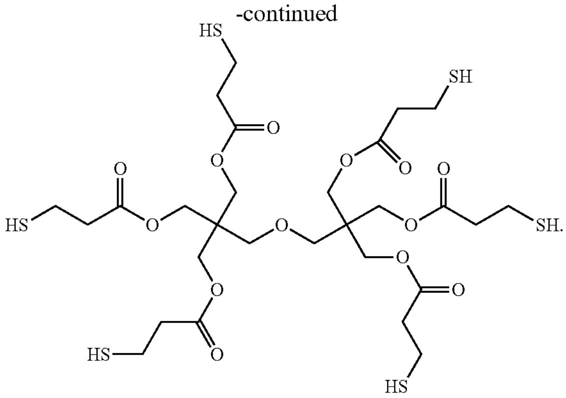

2,2,2′,2′-tetrakis(3-mercaptopropanoyl)-3,3′(3-mercaptopropanoyl)-1,1′-dipropyl ether (DPEH3MP, from TCI)

Various other epoxy crosslinking agents that are suitable to be used in the composition of this invention include, but are not limited to, bisphenol A epoxy resin (LX-1—Daiso Chemical Co., Osaka, Japan), 2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis(oxirane) (Techmore VG3101L—Mitsui Chemical Inc.), and 1,1,3,3,5,5-hexamethyl-1,5-bis(3-(oxiran-2-ylmethoxy)propyl)trisiloxane (DMS-E09—Gelest, Inc.), bis(4-(oxiran-2-ylmethoxy)phenyl)methane (EPON™ 862, Hexion Specialty Chemicals, Inc.), triglycidyl ether of poly(oxypropylene) epoxide ether of glycerol (commercially available as Heloxy 84 or GE-36 from Momentive Specialty Chemicals Inc.), 2-((4-(tert-butyl)phenoxy)methyl)oxirane (commercially available as Heloxy 65 from Momentive Specialty Chemicals Inc.) and silicone modified epoxy compound (commercially available as BY16-115 from Toray-Dow Corning Silicone Co., Ltd.) as shown below:

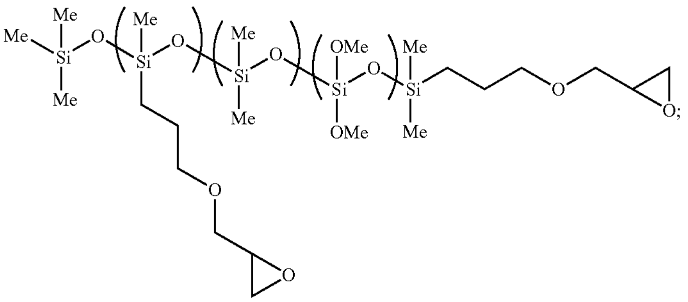

Silicone modified epoxy compound commercially available by BY16-115 from Toray-Dow Corning Silicone Co., Ltd

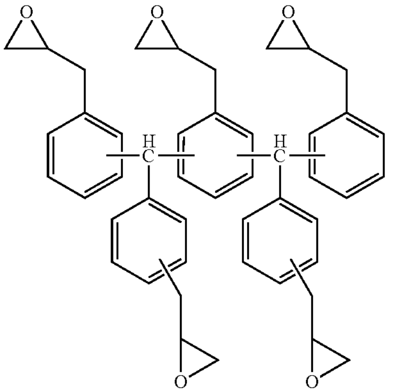

; and

JER1032H60, available from Nippon Kayaku Co., Ltd

-continued

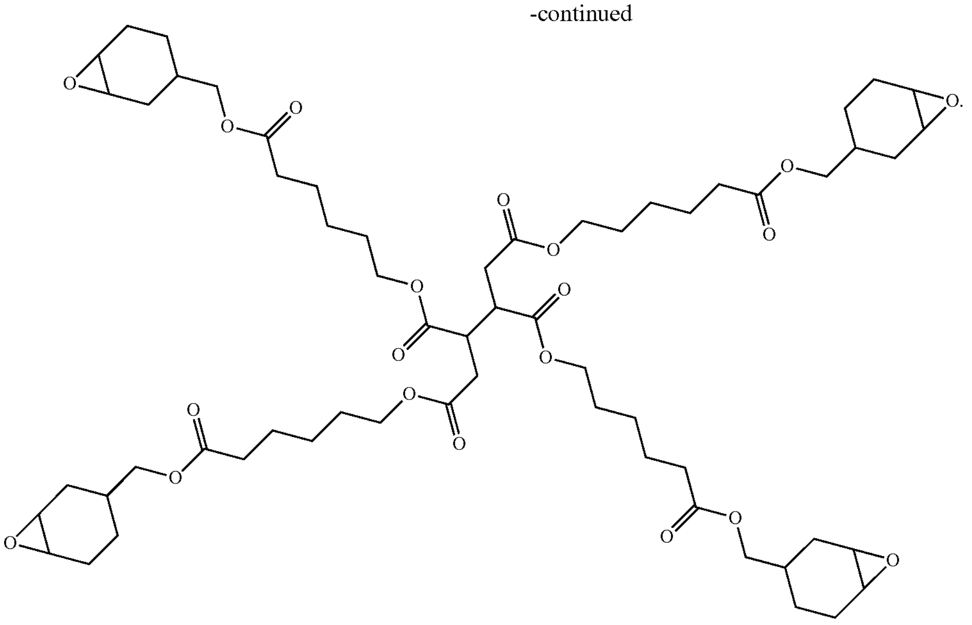

GT-401, available from Daicel Corp

The photosensitive composition of this invention further encompasses one or more compounds or additives having utility as, among other things, thermal radical initiator, adhesion promoter, a surface leveling agent, antioxidants, a synergist, silane coupling agents, phenolic resins, flame retardants, plasticizers, curing accelerators, and the like. It should be noted however that several of these compounds or classes of compounds may exhibit more than one type of functional effect and thus it is not limited by their one functional benefit. For example, a few of the photo radical initiators as described herein are also suitable as photo base generators. Also, as already mentioned above, several of the photosensitizers as exemplified herein are themselves photo radical generators.

Suitable generic examples of surface leveling agents include a variety of non-ionic, amphoteric and anionic surfactants available in the art, which provide, among other things, wetting, spreading and levelling properties. Exemplary surface leveling agents include without any limitation, non-ionic polymeric fluorochemical surfactant, such as for example, FC-4432 available from 3M Advanced Materials Division, a short chain perfluoro-based ethoxylated nonionic fluorosurfactant, such as for example, Chemguard S-550, CAPSTONE fluorosurfactants available as both nonionic and amphoteric forms from DuPont, PolyFox fluorosurfactants from OMNOVA Solutions, and the like. In addition, any of the known conventional surfactants may be used in combination with the above noted surfactants, such known non-ionic surfactants include for example, perfluoroalkyl polyoxyethylene ethanols, fluorinated alkyl esters, perfluoroalkylamine oxides and fluorinated organosiloxane compounds. Various other such commercially available surfactants include Florade FC-4430 from Sumitomo 3M Ltd., Surflon S-141 and S-145 from Asahi Glass Co., Ltd., Unidyne DS-401, DS-4031 and DS-451 from Daikin Industries Ltd., Megaface F-8151 from Dainippon Ink & Chemicals, Inc., and X-70-093 from Shin-Etsu Chemical Co., Ltd.

In some embodiments the composition of this invention includes a thermal radical initiator. Any of the compounds which when exposed to heat forms a radical can be employed for this purpose. Suitable generic classes of such compounds include peroxides, peracids, azo compounds, N-alkoxyamines, N-acyloxyamines, and the like. Non-limiting examples of such specific thermal radical generators include benzoyl peroxide, dicumyl peroxide, m-chloroperbenzoic acid, methyl ethyl ketone peroxide, azobisisobutyronitrile (AIBN), and the like.

Non-limiting examples of such other compounds or additives are selected from the group consisting of the following, commercially available materials are indicated by such commercial names.

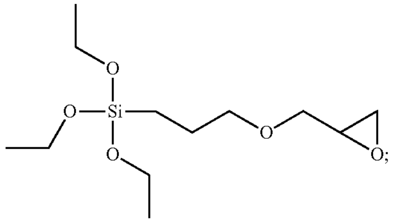

triethoxy(3-(oxiran-2-ylmethoxy)propyl)silane, also commonly known as 3-glycidoxypropyl triethoxysilane (3-GTS or (KBE-403 from Shin-Etsu Chemical Co., Ltd.))

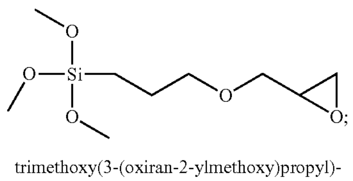

trimethoxy(3-(oxiran-2-ylmethoxy)propyl)-silane, also commonly known as 3-glycidoxypropyl trimethoxysilane (KBM-403E from Shin-Etsu Chemical Co., Ltd.))

-continued $C_6H_5(CH_3O)_3Si$ phenyltrimethoxysilane;

$C_6H_5(C_2H_5O)_3Si$ phenyltriethoxysilane (KBE-103 commercially available from Gelest or Shin-Etsu Chemical Co., Ltd.)

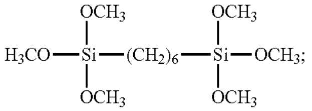

3,3,10,10-tetramethoxy-2,11-dioxa-3,10-disiladodecane (SIB-1832 from Gelest)

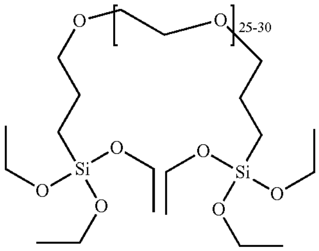

;

N,N'-bis[(3-triethoxysilylpropyl) aminocarbonyl]polyethylene oxide (SIB-1824.84 from Gelest)

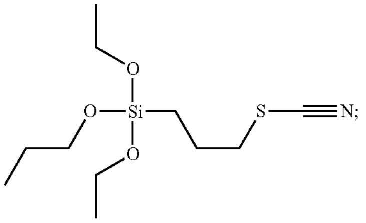

diethoxy(propoxy)(3-thiocyanatopropyl)silane (SIT7908.0 from Gelest)

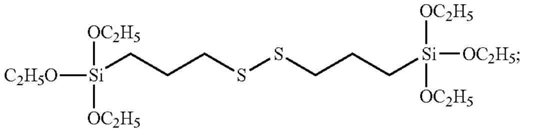

4,4,13,13-tetraethoxy-3,14-dioxa-8,9-dithia-4,13-disilahexadecane

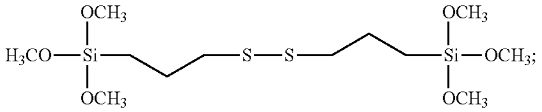

3,3,12,12-tetramethoxy-2,13-dioxa-7,8-dithia-3,12-disilatetradecane (Si-75 or Si-266 from Evonik)

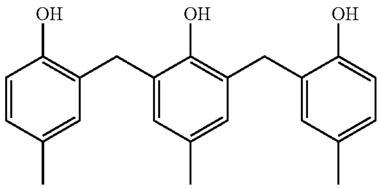

; and 2,2'-((2-hydroxy-5-methyl-1,3-phenylene)bis-(methylene))bis(4-methylphenol) (antioxidant AO-80 from TCI Japan)

-continued

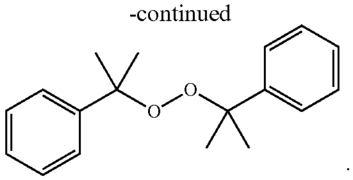

dicumyl peroxide (DCP)

In general among other things, various compounds and additives as enumerated herein improve overall performance of the photosensitive composition of this invention thus providing well defined photo-patterned structures having a variety of utilities, including but not limited to chip-stack applications, redistribution layers and for forming CMOS image sensor dam structures. Advantageously, it has also been found that certain of the additives as described herein may feature more than one function. For example, some of the additives as enumerated hereinabove may not only exhibit certain photosensitization activity during exposure to radiation but may also facilitate as a cross linking agent as further described above. Therefore, additives as used herein do not limit the activity of such compounds to only one of such property but may also facilitate other functions of the photosensitive compositions of this invention.

The photosensitive composition embodiments, in accordance with the present invention, are first applied to a desired substrate to form a film. Such a substrate includes any appropriate substrate as is, or may be used for electrical, electronic or optoelectronic devices, for example, a semiconductor substrate, a ceramic substrate, a glass substrate. With regard to said application, any appropriate coating method can be employed, for example, spin coating, spraying, doctor blading, meniscus coating, ink jet coating and slot coating.

Next, the coated substrate is heated to facilitate the removal of residual casting solvent, for example to a temperature from 70° C. to 130° C. for from 1 to 30 minutes, although other appropriate temperatures and times can be used. After the heating, the film is generally imagewise exposed to an appropriate wavelength of actinic radiation, wavelength is generally selected based on the choice of the photo radical generator and/or photosensitizer incorporated into the polymer composition as described herein. However, generally such appropriate wavelength is from 200 to 700 nm. It will be understood that the phrase "imagewise exposure" means exposing through a masking element to provide for a resulting pattern of exposed and unexposed portion of the film, as further illustrated by specific examples hereinbelow.

After an imagewise exposure of the film formed from photosensitive composition in accordance with the present invention, a development process is employed. For the negative tone compositions as contemplated by the present invention, such development process removes only the unexposed portions of the film thus leaving a negative image of the masking layer in the film. A post exposure bake (PEB) is then employed prior to the aforementioned development process, generally at a temperature from 100° C. to 130° C. for from 1 to 10 minutes, although other appropriate temperatures and times can be used.

Suitable developers can include organic solvents such as propylene glycol methyl ether acetate (PGMEA), 2-heptanone, cyclohexanone, NMP, GBL, cyclopentanone, butyl acetate, and mixtures in any combination thereof, among others.

Thus some composition embodiments of the present invention provide self-imageable films that after imagewise exposure, the resulting image is developed using an organic solvent. After the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has already been exposed during the imagewise exposure, image fixing is generally accomplished by causing further reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure or a higher energy source and may be for a longer period of time although any other appropriate energy source can be employed. The heating is generally carried out at a desirable temperature, for example, from above 150° C. for a time of from 40 min to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

The devices are produced by using embodiments of the composition of the present invention to form layers which are characterized as having high heat resistance, an appropriate water absorption rate, high transparency, and low permittivity. In addition, such layers generally have an advantageous thermo-mechanical properties. Most notably, improved tensile strength, improved elongation to break (ETB) and exhibit higher glass transition temperatures ($T_g$) when compared with conventional materials. For example, the tensile strength of the fully cured composition layer may be higher than 120 MPa and may be in the range of from about 120 MPa to 200 MPa or higher. The ETB of the cured composition layers can be higher than 30 percent and may range from about 40 percent to 100 percent or higher. The $T_g$ of the cured composition layer may be higher than 150° C. and can range from about 150° C. to 200° C. or higher. It should further be noted that the layers formed in this fashion from the composition of this invention also exhibit unusually high thermal decomposition temperature. Accordingly, the 5 percent weight loss temperature ($T_{d5}$) of the cured polymeric layers is generally higher than 250° C. and can range from 280° C. to 350° C. or higher, thus offering hitherto unattainable properties.

As previously mentioned, exemplary applications for embodiments of the photosensitive compositions in accordance with the present invention include die attach adhesive, wafer bonding adhesive, insulation films (interlayer dielectric layers), protecting films (passivation layers), mechanical buffer films (stress buffer layers) or flattening films for a variety of semiconductor devices, and printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a negative tone photosensitive polymer composition which exhibits enhanced characteristics with respect to one or more of mechanical properties (such as high tensile strength, elongation to break) and at least equivalent or better chemical resistance, as compared to alternate materials. In addition, such embodiments provide generally excellent electrical insulation, adhesion to the substrate, and the like. Thus semiconductor devices, device packages, and display devices are provided that incorporate embodiments in accordance with the present invention.

Advantageously, it is contemplated that the photosensitive compositions of this invention are useful to form adhesive layers for bonding the semiconductor chips to each other, such as in chip-stack applications. For example, a bonding layer used for such a purpose is composed of a cured product of the photosensitive adhesive composition of the present invention. It is anticipated that the adhesive layer can be a single-layer structure, expected to exhibit sufficient adhesiveness to the substrate and free of significant stress resulting due to the curing step. Thus avoiding undesirably thick layer of film encompassing the chip as a laminate. It is further anticipated that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it is now possible to form a variety of electronic devices featuring hitherto unachievable level of miniaturization, thinning and light-weight, and the function of the semiconductor device is not easily damaged even if such devices are subject to rugged operations such as swinging or dropping.

A cured product of the photosensitive adhesive composition of the present invention, i.e., the adhesive layer or the film is expected to exhibit an indentation modulus of 2 to 3.5 GPa at 25° C. The cured product of the photosensitive adhesive composition of the present invention exhibits an indentation modulus of 70 to 120% of the indentation modulus of the non-cured product at 25° C., i.e., before such curing step. Further, the photosensitive adhesive composition of the present invention exhibits an excellent adhesiveness to a suitable substrate, such as for example a semiconductor chip, and adhesiveness of 20 to 200 Newton (N) at 25° C. can be achieved before curing and generally after etching and ashing process.

The photosensitive adhesive composition of the present invention in a state before cured after etching process and ashing process is expected to exhibit sufficient stickiness with the semiconductor chip as required in die bonding. Therefore, the adhesive layer for bonding the semiconductor chips to each other securely fixes the semiconductor chips to each other and contributes to improvement of the reliability of the chip laminate.

As a result, it is possible to realize the adhesive layer having sufficiently both adhesiveness and stress relaxation by employing the photosensitive adhesive composition of the present invention. In other words, since the adhesive layer has both element protective function of buffer coat film (or, buffer coat function) and adhesive function of die bonding film (or, die bonding function) with a single layer, it is possible to form the chip laminate without decreasing the reliability and to thin the chip laminate as compared to the conventional one in two layers as well. Further, it is possible to reduce the volume of the mold portion and to shorten the bonding wire due to thinning of the chip laminate, thereby these factors contribute to light-weight and cost-savings.

Further, in some embodiments of this invention as described above, the electronic and/or the semiconductor device according to this invention encompass a laminated semiconductor element where said lamination consists of a photosensitive composition according to the present invention.

In some embodiments of this invention, the semiconductor device encompassing a redistribution layer (RDL) structure further incorporates a photosensitive composition according to this invention.

Further, in some embodiments of this invention as described above, the semiconductor device encompassing a chip stack structure further includes a photosensitive composition according to this invention.

In yet some other embodiments of this invention as described above, the semiconductor device encompassing a complementary metal oxide semiconductor (CMOS) image sensor dam structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a photosensitive composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photopattern; and curing the film by heating to a suitable temperature.

The coating of the substrate with photosensitive composition of this invention can be performed by any of the coating procedures as described herein and/or known to one skilled in the art, such as by spin coating.

In another aspect of this invention there is also provided a cured product comprising the composition of this invention.

This invention is further illustrated by the following examples which are provided for illustration purposes and in no way limit the scope of the present invention.

EXAMPLES (GENERAL)

The following abbreviations have been used hereinbefore and hereafter in describing some of the compounds, instruments and/or methods employed to illustrate certain of the embodiments of this invention:

6FDA—5,5'-(perfluoropropane-2,2-diyl)bis(isobenzofuran-1,3-dione);
PMDA—1H,3H-benzo[1,2-c:4,5-c']difuran-1,3,5,7-tetraone;
6BF—4,4'-([1,1'-biphenyl]-4,4'-diylbis(oxy))bis(3-(trifluoromethyl)aniline);
PFMB—2,2'-bis(trifluoromethyl)-[1,1'-biphenyl]-4,4'-diamine;
DO3—4,4'-methylenebis(2,6-dimethylaniline);
2-$NH_2$PhSH—2-aminobenzenethiol;
DMMIEt-$NH_2$— 1-(2-aminoethyl)-3,4-dimethyl-1H-pyrrole-2,5-dione;
MA—maleic anhydride;
DMMA—dimethyl maleic anhydride;
IA—itaconic anhydride;
IRGACURE 369-2-benzyl-2-(dimethylamino)-1-(4-morpholinophenyl)butan-1-one;
CPTX-1-chloro-4-propoxy-9H-thioxanthen-9-one;
DCP—dicumyl peroxide;
Rhodorsil 2074—(4-methylphenyl)(4-isopropylphenyl) iodonium tetrakis(perfluorophenyl)borate;
TAEICY—(2,4,6-trioxo-1,3,5-triazinane-1,3,5-triyl)tris (ethane-2,1-diyl) triacrylate;
TMPTGE—2,2'-(((2-ethyl-2-((oxiran-2-ylmethoxy) methyl)propane-1,3-diyl)bis(oxy))bis(methylene))bis (oxirane);
A-TMM—2-((acryloyloxy)methyl)-2-(hydroxymethyl) propane-1,3-diyl diacrylate;
DENACOL EX 614B—(2R,3R,4R,5S)-1,3,5,6-tetrakis (oxiran-2-ylmethoxy)hexane-2,4-diol;
DENACOL EX 946L—propylene glycol diglycidyl ether;
KBM-403E—trimethoxy(3-(oxiran-2-ylmethoxy)propyl) silane;
SIT7908.0—diethoxy(propoxy)(3-thiocyanatopropyl)silane;
FC-4432—a non-ionic polymeric fluorochemical surfactant;
NMP—N-methyl-2-pyrrolidone;
GBL—γ-butyrolactone;
DMAc—N,N-dimethylacetamide;
DMSO—dimethyl sulfoxide;
THE—tetrahydrofuran;
PAG—photoacid generator;
GPC—gel permeation chromatography;
$M_w$—weight average molecular weight;
$M_n$—number average molecular weight;
PDI—polydispersity index;
$^1$H-NMR—proton nuclear magnetic resonance spectroscopy;
FT-IR—Fourier transform infrared spectroscopy;
ppm—parts per million;
pphr—parts per hundred parts of resin;

Example 1

6FDA/PMDA/6BF/PFMB (25/25/30/20)

6BF (15.13 g, 30 mmol) and PFMB (6.41 g, 20 mmol) were dissolved in NMP (152.4 g) and stirred at ambient temperature under a nitrogen atmosphere. To this solution was then added a mixture of 6FDA (11.11 g, 25 mmol) and PMDA (5.45 g, 25 mmol) in small batches while stirring that generated about 5° C. exotherm. After which time the reaction mixture was continued to stir at ambient temperature for 20 hours during which time the solution turned viscous indicating the formation of polyamic acid. To this viscous solution additional amount of NMP (184 g) was added and a small portion of which was characterized by GPC (GPC-DMAc-$M_w$=258,950, $M_n$=124,450, PDI=2.08).

The polyamic acid solution as obtained above (236 g containing 23.6 g polymer) was mixed with anhydrous pyridine (23.9 g), acetic anhydride (24 g) and cyclopentanone (60.6 g) and the solution heated to 95° C. for 4 hours under nitrogen atmosphere while stirring. The reaction mixture was allowed to cool to ambient temperature and added to excess water/methanol (80/20) mixture (2 L) to isolate the polymer. The gummy product was washed with excess (2 L) water/methanol (80/20) mixture and dried in a vacuum oven at 70° C. for 24 hours to obtain a solid product (23 g, 97% isolated yield, GPC-DMAc-$M_w$=275,750, $M_n$=114,750, PDI=2.40). $^1$H-NMR (500 MHz) spectra measured in deuterated DMSO showed only traces of a broad peak centered at about 13.0 ppm for COOH and 11.13 ppm, 10.99 ppm and 10.86 ppm for —NH— groups of the poly(amic acid) indicating that the polyamic acid was quantitatively imidized. Multiple peaks at 6.7-8.6 ppm for the aromatic protons for 6FDA, PMDA, 6BF and PFMB were also observed. FT-IR spectra showed peaks at 1375 $cm^{-1}$ and 723 $cm^{-1}$ characteristic of polyimides.

Example 2

6FDA/PMDA/6BF/PFMB/DMMIEt-$NH_2$ (24.7/24.7/29/19.1/2.5)

6BF (14.82 g, 29.4 mmol), PFMB (6.21 g, 19.4 mmol) and DMMIEt-$NH_2$ (0.42 g, 2.5 mmol) were dissolved in NMP (152 g) and stirred at ambient temperature under a nitrogen atmosphere. To this solution was then added a mixture of 6FDA (11.11 g, 25 mmol) and PMDA (5.45 g, 25 mmol) in small batches while stirring. The reaction mixture was stirred at ambient temperature for 20 hours during which time the solution became viscous. To this viscous solution was then added NMP (72 g). A small portion of this solution was further diluted with DMAc for GPC analysis. GPC-DMAc-$M_w$=131,500, $M_n$=72,550, PDI=1.81. A small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product, which was characterized by $^1$H NMR. $^1$H-NMR (500 MHz) spectra of this product measured in deuterated DMSO showed peaks at 10.97 ppm, 10.87 ppm, and 10.85 ppm for —NH— groups of the polyamic acid. Multiple peaks in 6.7-8.7 ppm for the aromatic protons from 6FDA, PMDA PFMB and 6BF were also observed.

The polyamic acid solution thus obtained (199.8 g containing about 30 g polymer) was mixed with anhydrous pyridine (30.7 g), acetic anhydride (31.3 g) and cyclopentanone (88 g) and the solution was heated to 95° C. for 6 hours under nitrogen atmosphere while stirring. The reaction mixture was allowed to cool to ambient temperature and THE was (100 g) added. This solution was then added to excess water/methanol (80/20) mixture (2.5 L) to isolate the polymer. The gummy product was washed with excess (2.5 L) water/methanol (80/20) mixture and dried in a vacuum oven at 90° C. for 30 hours to obtain a solid product (28.9 g, 96% isolated yield, GPC-DMAc $M_w$=130,350, $M_n$=63,500, PDI=2.05.

Example 3

6FDA/PMDA/6BF/PFMB/DMMIEt-$NH_2$ (24.7/24.7/29.0/19.1/2.5)

6BF (17.78 g, 35.3 mmol), PFMB (7.45 g, 23.3 mmol) and DMMIEt-$NH_2$ (0.51 g, 3 mmol) were dissolved in NMP (182.4 g) and stirred at ambient temperature under a nitrogen atmosphere. A mixture of 6FDA (13.33 g, 30 mmol) and PMDA (6.54 g, 30 mmol) was then added in small batches to the above solution while stirring. The reaction mixture was stirred at ambient temperature for 20 hours during which time the solution turned viscous. An additional amount of NMP (62 g) was added to this viscous solution. A small portion of this solution was further diluted with DMAc for GPC analysis. GPC-DMAc-$M_w$=121,150, $M_n$=69,500, PDI=1.74. A small sample of this polymer solution was also added to excess water/acetone (80/20) mixture to isolate the polymer. The gummy product was washed with excess water/acetone (80/20) mixture and dried in a vacuum oven at 50-60° C. for 24 hours to obtain a solid product, which was characterized by $^1$H NMR. $^1$H-NMR (500 MHz) spectra measured in deuterated DMSO showed a broad peak centered at about 13.5 ppm for COOH and 10.97 ppm, 10.87 ppm, and 10.85 ppm for —NH— groups of the polyamic acid in approximately 1:1 ratio. Multiple peaks were observed at 6.7-8.7 ppm for the aromatic protons from 6FDA, PMDA PFMB and 6BF.

The polyamic acid solution thus obtained (194.8 g containing about 31 g polymer) was then mixed with anhydrous pyridine (31.1 g), acetic anhydride (32.1 g) and cyclopentanone (60 g) and the solution was heated to 95° C. for 6 hours under nitrogen atmosphere while stirring. The reaction mixture was allowed to cool to ambient temperature and THE (51 g) was added. This solution was then added to excess water/methanol (80/20) mixture (2.5 L) to isolate the polymer. The gummy product was washed with excess (2.5 L) water/methanol (80/20) mixture and dried in a vacuum oven at 70° C. for 24 hours to obtain a solid product (31.5 g). The product was characterized by GPC and $^1$H NMR. GPC-DMAc $M_w$=90,350, $M_n$=48,000, PDI=1.88. $^1$H-NMR (500 MHz) spectra measured in deuterated DMSO showed only traces of a broad peak centered at around 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA PFMB and 6BF. FT-IR spectra showed peaks at 1375 $cm^{-1}$ and 723 $cm^{-1}$ characteristic of polyimides.

Example 4

6FDA/PMDA/6BF/PFMB/DMMIEt-$NH_2$ (24.7/24.7/29/19.1/2.5)

6BF (14.82 g, 29.4 mmol), PFMB (6.2 g, 19.4 mmol) and DMMIEt-$NH_2$ (0.42 g, 2.5 mmol) were dissolved in NMP (152 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was stirred at ambient temperature for 20 hours during which time the solution turned viscous. An additional amount of NMP (127 g) was added to the viscous solution. A small portion of this solution was further diluted with DMAc for GPC analysis. GPC-DMAc-$M_w$=114,100, $M_n$=69,050, PDI=1.65. A small sample of the solid polyamic acid was also isolated for $^1$H NMR (500 MHz) analysis. $^1$H NMR spectra measured in deuterated DMSO showed peaks at 10.97 ppm, 10.87 ppm, 10.85 ppm and 10.82 ppm for —NH— groups of the polyamic acid. Multiple peaks were observed at 6.7-8.7 ppm for the aromatic protons from 6FDA, PMDA PFMB and 6BF.

The polyamic acid solution (214.1 g containing about 26 g polymer) thus obtained was mixed with anhydrous pyridine (25.4 g), acetic anhydride (25.5 g) and cyclopentanone (78 g) and the solution was heated to 95° C. for 6 hours under nitrogen atmosphere while stirring. The reaction mixture was allowed to cool to ambient temperature and THE (100 g) was added. This solution was then added to excess water/methanol (80/20) mixture (2.5 L) to isolate the polymer. The gummy product was washed with excess (2 L) water/methanol (80/20) mixture and dried in a vacuum oven at 70° C. for 24 hours to obtain a solid product (25 g, 96% yield) and was characterized by GPC and $^1$H NMR. GPC-DMAc–$M_w$=169,000, $M_n$=81,700, PDI=2.07. $^1$H-NMR (500 MHz) spectra measured in deuterated DMSO showed only traces of a broad peak centered at around 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA PFMB and 6BF.

Example 5

6FDA/PMDA/6BF/PFMB/DMMIEt-$NH_2$ (24.6/24.6/28.6/18.8/3.4)

6BF (14.69 g, 29.1 mmol), PFMB (6.13 g, 19.1 mmol) and DMMIEt-$NH_2$ (0.59 g, 3.5 mmol) were dissolved in NMP (151.9 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was stirred at ambient temperature for 20 hours during which time the solution turned viscous. An additional amount of NMP (69 g) was added to this viscous solution. A small portion of this solution was further diluted with DMAc for GPC analysis. GPC-DMAc–$M_w$=111,042, $M_n$=64,700, PDI=1.72. A small sample of the solid polyamic acid was also isolated for $^1$H NMR (500 MHz) analysis. $^1$H NMR (500 MHz) spectra measured in deuterated DMSO showed peaks at 10.87 ppm, 10.87 ppm, and 10.85 ppm for —NH— groups of the polyamic acid. Multiple peaks were observed at 6.7-8.7 ppm for the aromatic protons from 6FDA, PMDA PFMB and 6BF.

The polyamic acid solution (200 g containing about 30 g polymer) thus obtained was mixed with anhydrous pyridine (32.9 g), acetic anhydride (30.3 g) and cyclopentanone (33 g) and the solution was heated to 95° C. for 6 hours under nitrogen atmosphere while stirring. The reaction mixture was allowed to cool to ambient temperature and THE (25 g) was added. This solution was then added to water/methanol (80/20) mixture (2.5 L) to isolate the polymer. The gummy product was washed with (2 L) water/methanol (80/20) mixture and dried in a vacuum oven at 80-90° C. for 24 hours to obtain a solid product (28 g, 93% yield) and characterized by GPC and $^1$H NMR. GPC-DMAc–$M_w$=94,200, $M_n$=47,000, PDI=2.01. $^1$H-NMR (500 MHz) spectra measured in deuterated DMSO showed only traces of peaks at 10.5-11.5 ppm for —NH— groups indicating that the polyamic acid was quantitatively imidized. Multiple peaks were observed at 6.7-8.7 ppm for the aromatic protons from 6FDA, PMDA PFMB and 6BF. FT-IR spectra showed peaks at 1373 $cm^{-1}$ and 723 $cm^{-1}$ characteristic of polyimides.

Example 6

6FDA/PMDA/6BF/PFMB/DMMIEt-$NH_2$ (24.7/24.7/14.2/33.9/2.5)

6BF (7.25 g, 14.4 mmol), PFMB (11 g, 34.4 mmol) and DMMIEt-$NH_2$ (0.42 g, 2.5 mmol) were dissolved in NMP (141 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was stirred at ambient temperature for 20 hours during which time the solution turned viscous. An additional amount of NMP (120 g) was added to the viscous solution. A small portion of this solution was further diluted with DMAc for GPC analysis. GPC-DMAc–$M_w$=84,300, $M_n$=53,650, PDI=1.57. A small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product.

The polyamic acid solution (234.0 g containing about 28 g polymer) thus obtained above was mixed with anhydrous pyridine (28.8 g), acetic anhydride (29.5 g) and cyclopentanone (60 g) and the solution heated to 95° C. for 6 hours under nitrogen atmosphere while stirring. The reaction mixture was allowed to cool to ambient temperature and THE (100 g) was added. This solution was then added to water/methanol (80/20) mixture (2.5 L) to isolate the polymer. The gummy product was washed with (2 L) water/methanol (80/20) mixture and dried in a vacuum oven at 70° C. for 24 hours to obtain a solid product (27.5 g, 98% yield), and was characterized by GPC and $^1$H NMR. GPC-DMAc–$M_w$=180,750, $M_n$=74,700, PDI=2.42. $^1$H-NMR (500 MHz) spectra measured in deuterated DMSO showed only traces of a broad peak centered at about 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA PFMB and 6BF. FT-IR spectra showed peaks at 1372 $cm^{-1}$ and 723 $cm^{-1}$ characteristic of polyimides.

Example 7A

6FDA/PMDA/6BF/DO3/DMMIEt-$NH_2$ (24.7/24.7/29.6/19.1/2.5)

6BF (14.82 g, 29.4 mmol), DO3 (4.99 g, 19.4 mmol) and DMMIEt-$NH_2$ (0.42 g, 2.5 mmol) were dissolved in NMP (147.1 g) and stirred at ambient temperature under a nitrogen atmosphere. A mixture of 6FDA (11.11 g, 25 mmol) and PMDA (5.45 g, 25 mmol) was added in small batches to this solution while stirring. The reaction mixture was then stirred at ambient temperature for 20 hours during which time the solution turned viscous. An additional amount of NMP (78 g) was added to this viscous solution. A small portion of this solution was further diluted with DMAc for GPC analysis. GPC-DMAc–$M_w$=96,500, $M_n$=58,300, PDI=1.65. A small sample of the solid polyamic acid was also isolated for $^1$H NMR (500 MHz) analysis. $^1$H-NMR (500 MHz) spectra measured in deuterated DMSO showed a broad peak centered at about 13.5 ppm for COOH and 10.87 ppm, 10.84 ppm, 9.90 ppm and 9.88 ppm for —NH— groups of the polyamic acid in approximately 1:1 ratio. Multiple peaks were observed at 6.7-8.7 ppm for the aromatic protons from 6FDA, PMDA, DO3 and 6BF.

The polyamic acid solution (200 g containing about 28 g polymer) thus obtained above was then mixed with anhydrous pyridine (28.1 g), acetic anhydride (29.2 g) and cyclopentanone (81 g) and the solution was heated to 90° C. for 5 hours under nitrogen atmosphere while stirring. The reaction mixture was allowed to cool to ambient temperature and THE (100 g) was added. This solution was then added to water/acetone (80/20) mixture (2.5 L) to isolate the polymer. The gummy product was washed with (2.5 L) water/acetone (80/20) mixture and dried in a vacuum oven at 80-90° C. for 24 hours to obtain a solid product (26.8 g, 96% yield) and was characterized by GPC and $^1$H NMR. GPC-DMAc–$M_w$=106,550, $M_n$=55,750, PDI=1.95. $^1$H-NMR (500 MHz) spectra measured in deuterated DMSO showed only traces of a broad peak centered at around 13.5 ppm for COOH and 10-11 ppm for —NH— groups indicating that the polyamic acid was quantitatively imidized. Multiple peaks were observed at 6.7-8.7 ppm for the aromatic protons from 6FDA, PMDA DO3 and 6BF.

Example 7B

PMDA/6FDA/DO3/6BF/DMMIEt-$NH_2$ (34.6/14.9/29.0/19.1/2.5)

DO3 (7.47 g, 29.4 mmol), 6BF (9.77 g, 19.4 mmol) and DMMIEt-$NH_2$ (0.42 g, 2.5 mmol) were dissolved in NMP (128 g) and stirred at ambient temperature under a nitrogen atmosphere. To this solution was added a mixture of 6FDA (6.66 g, 15 mmol) and PMDA (7.63 g, 35 mmol) in small batches while stirring. The reaction mixture was stirred at ambient temperature for 20 hours during which time the solution became viscous. To this viscous solution was then added NMP (89 g). A small portion of this solution was further diluted with DMAc for GPC analysis. GPC-DMAc–$M_w$=115,400, $M_n$=55,950, PDI=2.06.

The polyamic acid solution thus obtained (220 g containing about 28 g polymer) was mixed with anhydrous pyridine (10 g), acetic anhydride (10 g) and cyclopentanone (80 g) and the solution was heated to 90° C. for 4 hours under nitrogen atmosphere while stirring. The reaction mixture was allowed to cool to ambient temperature and THE was (100 g) added. This solution was then added to excess water/methanol (80/20) mixture (2.5 L) to isolate the polymer. The gummy product was washed with excess (2.5 L) water/methanol (80/20) mixture and dried in a vacuum oven at 110° C. for 30 hours to obtain a solid product (26 g, 93% isolated yield, GPC-DMAc–$M_w$=113,650, $M_n$=48,700, PDI=2.33.

Example 7C

PMDA/6FDA/DO3/PFMB/DMMIEt-$NH_2$ (34.6/14.9/29.0/19.1/2.5)

DO3 (11.21 g, 44.1 mmol), PFMB (9.31 g, 29.1 mmol) and DMMIEt-$NH_2$ (0.63 g, 3.75 mmol) were dissolved in NMP (170 g) and stirred at ambient temperature under a nitrogen atmosphere. To this solution was added a mixture of 6FDA (9.99 g, 22.5 mmol) and PMDA (11.45 g, 52.5 mmol) in small batches while stirring. The reaction mixture was stirred at ambient temperature for 20 hours during which time the solution became viscous. To this viscous solution was then added NMP (117 g). A small portion of this solution was further diluted with DMAc for GPC analysis. GPC-DMAc–$M_w$=83,550, $M_n$=40,650, PDI=2.06.

The polyamic acid solution thus obtained (330 g containing about 42 g polymer) was mixed with anhydrous pyridine (10 g), acetic anhydride (20 g) and cyclopentanone (75 g) and the solution was heated to 90° C. for 6 hours under nitrogen atmosphere while stirring. The reaction mixture was allowed to cool to ambient temperature and THE was (150 g) added. This solution was then added to excess water/methanol (80/20) mixture (2.5 L) to isolate the polymer. The gummy product was washed with excess (2.5 L) water/methanol (80/20) mixture and dried in a vacuum oven at 110-120° C. for 30 hours to obtain a solid product (39.2 g, 92% isolated yield, GPC-DMAc–$M_w$=109,950, $M_n$=57,850, PDI=1.87.

Example 8

6FDA/PMDA/6BF/PFMB/2-$NH_2$PhSH (24.7/24.7/29.0/19.1/2.5)

6BF (14.82 g, 29.4 mmol), PFMB (6.21 g, 19.4 mmol) and 2-$NH_2$PhSH (0.31 g, 2.5 mmol) were dissolved in NMP (151.6 g) and stirred at ambient temperature under a nitrogen atmosphere. To this solution was then added a mixture of 6FDA (11.11 g, 25 mmol) and PMDA (5.45 g, 25 mmol) in small batches while stirring. The reaction mixture was further stirred at ambient temperature for 20 hours at which time the solution turned viscous. To this viscous solution additional amount of NMP (65 g) was added and a small portion was taken for GPC analysis: GPC-DMAc–$M_w$=187,600, $M_n$=94,900, PDI=1.98. Another small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product. $^1$H-NMR (500 MHz) spectra measured in deuterated DMSO showed a broad peak centered at about 13.5 ppm for COOH and 10.99 ppm, 10.88 ppm, and 10.86 ppm for —NH— groups of the poly(amic acid) in approximately 1:1 ratio. Multiple peaks were also observed at 6.7-8.7 ppm corresponding to the aromatic protons from 6FDA, PMDA PFMB and 6BF.

The polyamic acid solution as obtained above (128.5 g containing about 19.4 g polymer) was mixed with anhydrous pyridine (19.4 g), acetic anhydride (19.4 g) and cyclopentanone (85 g) and the solution was heated to 90° C. for 6 hours under a nitrogen atmosphere while stirring. The reaction mixture was allowed to cool to ambient temperature and THE (50 g) was added. This solution was then added to excess water/methanol (80/20) mixture (2 L) to isolate the polymer. The gummy product was washed with excess (2 L) water/methanol (80/20) mixture and dried in a vacuum oven at 70° C. for 24 hours to obtain a solid product (19.1 g, 98% isolated yield.

Example 9

6FDA/PMDA/6BF/PFMB/MA (24.1/24.1/29.6/19.7/2.5)

6BF (15.13 g, 30 mmol) and PFMB (6.41 g, 20 mmol) were dissolved in NMP (151.7 g) and stirred at ambient temperature under a nitrogen atmosphere. To this solution was added a mixture of 6FDA (10.83 g, 24.4 mmol), PMDA (5.32 g, 24.4 mmol) and MA (0.245 g, 2.5 mmol) in small batches while stirring. The reaction mixture was continued to stir at ambient temperature for 20 hours during which time the solution turned viscous indicating the formation of polyamic acid. To this viscous solution was then added NMP (80 g) and a small portion was taken for GPC analysis: GPC-DMAc–$M_w$=96,200, $M_n$=49,950, PDI=1.93. A small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product. $^1$H-NMR (500 MHz) spectra measured in deuterated DMSO showed peaks at 10.97 ppm, 10.86 ppm, and 10.85 ppm for —NH— groups of the poly(amic acid). Multiple peaks were also observed at 6.7-8.7 ppm corresponding to the aromatic protons from 6FDA, PMDA PFMB and 6BF.

The polyamic acid solution as obtained above (207.5 g containing about 29 g polymer) was mixed with anhydrous pyridine (30 g), acetic anhydride (30.4 g) and cyclopentanone (68 g) and the solution was heated to 95° C. and maintained at this temperature for 6 hours under nitrogen atmosphere while stirring. The reaction mixture was allowed to cool to ambient temperature and THE (100 g) was added since the solution was very viscous. This solution was then added to excess water/methanol (80/20) mixture (2.5 L) to isolate the polymer. The gummy product was washed with excess (2.5 L) water/methanol (80/20) mixture and dried in a vacuum oven at 90° C. for 30 hours to obtain a solid product (28.9 g, 95% isolated yield, GPC-DMAc could not be run since this polymer deemed to have a very high molecular weight. $^1$H-NMR (500 MHz) spectra measured in deuterated DMSO showed only traces of peaks at 10-11 ppm for —NH— groups indicating that the poly(amic acid) was quantitatively imidized. Multiple peaks were also observed at 6.7-8.7 ppm for the aromatic protons from 6FDA, PMDA PFMB and 6BF. FT-IR spectra showed peaks at 1374 cm$^{-1}$ and 723 cm$^{-1}$ characteristic of polyimides.

Example 10

6FDA/PMDA/6BF/PFMB/MA (23.5/23.5/29.4/19.6/4.0)

6BF (18.16 g, 36 mmol) and PFMB (7.69 g, 24 mmol) were dissolved in NMP (181.6 g) and stirred at ambient temperature under a nitrogen atmosphere. To this solution was added a mixture of 6FDA (12.79 g, 28.8 mmol), PMDA (6.28 g, 28.8 mmol) and MA (0.47 g, 4.8 mmol) in small batches while stirring. The reaction mixture was then stirred at ambient temperature for 20 hours during which time it turned viscous indicating the formation of polyamic acid. A small portion of this solution was diluted with DMAc for GPC analysis. GPC-DMAc–$M_w$=76,000, $M_n$=46,000, PDI=1.65. Another small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product. $^1$H-NMR (500 MHz) spectra measured in deuterated DMSO showed a broad peak centered at about 13.5 ppm for COOH and 10.98 ppm and 10.84 ppm for —NH— groups of the poly(amic acid) in approximately 1:1 ratio. Multiple peaks were observed at 6.7-8.7 ppm corresponding to the aromatic protons from 6FDA, PMDA PFMB and 6BF. Multiple peaks were also observed at 6.2-6.6 ppm for the protons from MA end group.

The polyamic acid solution as obtained above (125 g containing about 25 g polymer) was mixed with anhydrous pyridine (6.43 g), acetic anhydride (13.4 g) and cyclopentanone (47 g) and the solution stirred at ambient temperature for 24 hours under nitrogen atmosphere. THE (63 g) was added since the solution was very viscous. This solution was then added to excess water/acetone (80/20) mixture (2 L) to isolate the polymer. The gummy product was washed with excess (2 L) water/methanol (80/20) mixture and dried in a vacuum oven at 70° C. for 24 hours to obtain a solid product (24.8 g, 99% isolated yield, GPC-DMAc $M_w$=83,900, $M_n$=47,250, PDI=1.78). $^1$H-NMR (500 MHz) spectra measured in deuterated DMSO showed only traces of a broad peak centered at about 13.5 ppm for COOH and 10-11 ppm for —NH— groups indicating that the poly(amic acid) was mostly imidized. Multiple peaks were observed at 6.7-8.7 ppm for the aromatic protons from 6FDA, PMDA PFMB and 6BF. FT-IR spectra showed peaks at 1374 cm$^{-1}$ and 723 cm$^{-1}$ characteristic of polyimides.

Example 11

6FDA/PMDA/6BF/PFMB/DMMA (24.1/24.1/29.6/19.7/2.5)

6BF (15.13 g, 30 mmol) and PFMB (6.41 g, 20 mmol) were dissolved in NMP (152 g) and stirred at ambient temperature under a nitrogen atmosphere. To this solution was then added a mixture of 6FDA (10.83 g, 24.4 mmol), PMDA (5.32 g, 24.4 mmol) and DMMA (0.32 g, 2.5 mmol) in small batches while stirring. The reaction mixture was then stirred at ambient temperature for 20 hours during which time the solution turned viscous indicating the formation of polyamic acid. Additional amounts of NMP (67 g) was added to this viscous solution. A small portion of which was diluted in DMAc for GPC analysis. GPC-DMAc–$M_w$=95,050, $M_w$=53,150, PDI=1.79. Another small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product. $^1$H-NMR (500 MHz) spectra measured in deuterated DMSO showed peaks at 10.97 ppm, 10.87 ppm, 10.84 ppm and 10.82 ppm for —NH— groups of the poly(amic acid). Multiple peaks in 6.7-8.7 ppm for the aromatic protons from 6FDA, PMDA PFMB and 6BF were also observed.

The polyamic acid solution as obtained above (200 g containing about 30 g polymer) was mixed with anhydrous pyridine (30.3 g), acetic anhydride (30.8 g) and cyclopentanone (33 g) and the solution was heated to 95° C. for 6 hours under nitrogen atmosphere while stirring. The reaction mixture was allowed to cool to ambient temperature and THE (25 g) added. This solution was then added to excess water/methanol (80/20) mixture (2.5 L) to isolate the polymer. The gummy product was washed with excess (2 L) water/methanol (80/20) mixture and dried in a vacuum oven at 70° C. for 24 hours to obtain a solid product (28.4 g, 95% isolated yield). GPC-DMAc–$M_w$=89,150, $M_n$=44,350, PDI=2.01). $^1$H-NMR (500 MHz) spectra measured in deuterated DMSO showed only traces of a broad peak centered at about 13.5 ppm for COOH or 10-11 ppm for —NH— groups indicating that the poly(amic acid) was quantitatively imidized. Multiple peaks were observed at 6.7-8.7 ppm for the aromatic protons from 6FDA, PMDA PFMB and 6BF. FT-IR spectra showed peaks at 1375 cm$^{-1}$ and 723 cm$^{-1}$ characteristic of polyimides.

Example 12

6FDA/PMDA/6BF/PFMB/IA (24.1/24.1/29.6/19.7/2.5)

6BF (15.13 g, 30 mmol) and PFMB (6.41 g, 20 mmol) were dissolved in NMP (150.7 g) and stirred at ambient temperature under a nitrogen atmosphere. To this solution was added a mixture of 6FDA (10.83 g, 24.4 mmol), PMDA (5.317 g, 24.4 mmol) and IA (0.280 g, 2.5 mmol) in small batches while stirring. The reaction mixture was then stirred at ambient temperature for 20 hours during which time the solution turned viscous indicating the formation of polyamic acid. Additional quantities of NMP (33 g) was added to this viscous solution. A small portion of which was diluted with DMAc for GPC analysis. GPC-DMAc–$M_w$=107,050, $M_n$=60,700, PDI=1.76. Another small sample of the polymer solution was added to excess water/acetone (80/20) mixture to isolate the polymer. The gummy product was washed with excess water/acetone (80/20) mixture and dried in a vacuum oven at 50-60° C. for 24 hours to obtain a solid product. $^1$H-NMR (500 MHz) spectra measured in deuterated DMSO showed a broad peak centered at about 13.5 ppm for COOH and 10.99 ppm, 10.88 ppm, and 10.86 ppm for —NH— groups of the poly(amic acid) in approximately 1:1 ratio. Multiple peaks in 6.7-8.7 ppm for the aromatic protons from 6FDA, PMDA PFMB and 6BF were also observed.

The polyamic acid as obtained above (65 g containing about 11 g polymer) was mixed with anhydrous pyridine (11 g), acetic anhydride (11 g) and cyclopentanone (62 g) and the solution was heated to 90° C. for 6 hours under nitrogen atmosphere while stirring. The reaction mixture was allowed to cool to ambient temperature and THE (25 g) was added. This solution was then added to excess water/methanol (80/20) mixture (1.7 L) to isolate the polymer. The gummy product was washed with excess (1.2 L) water/methanol (80/20) mixture and dried in a vacuum oven at 70° C. for 24 hours to obtain a solid product (10.4 g, 95% isolated yield). GPC-DMAc-$M_w$=143,800, $M_n$=66,150, PDI=2.17. $^1$H-NMR (500 MHz) spectra measured in deuterated DMSO did not show a broad peak centered at about 13.5 ppm for COOH or 10-11 ppm for —NH— groups indicating that the poly(amic acid) was quantitatively imidized. Multiple peaks were observed at 6.7-8.7 ppm for the aromatic protons from 6FDA, PMDA PFMB and 6BF. FT-IR spectra showed peaks at 1374 $cm^{-1}$ and 723 $cm^{-1}$ characteristic of polyimides.

Example 13 illustrates the benefit of using various additives as described herein in order to obtain optimal benefit from the compositions of this invention.

Example 13

Photo Imaging Studies

The polyimide of Example 8 was dissolved in a solvent mixture of GBL/cyclopentanone (6:4 weight ratio) to form 13 wt. % solution. This solution was mixed with CPTX as the photo-sensitizer (2 pphr), DCP as the thermal radical initiator (4 pphr), KBM-403E as the adhesion promoter (5 pphr), FC-4432 as the surface leveling agent (0.3 pphr) and GBL (100 pphr) as extra solvent. From this composition seven different forms of compositions were made by adding the following four additives: Rhodorsil 2074 as the photo acid generator, Irgacure-369 as the photo radical generator, TMPTGE as the epoxy cross linker and TAEICY as the acrylate cross linker. Table 1 summarizes the amounts of these additives in each of these seven compositions. Each of these seven compositions were then mixed in appropriately sized amber HDPE bottles. The compositions were then rolled for 18 hours to produce homogeneous solutions. Particle contamination was removed by filtering the compositions through a 0.2 μm pore polytetrafluoroethylene (PTFE) disc filters. The filtered compositions were collected in low particle HDPE amber bottles and stored at 5° C.

TABLE 1

| Example No. | Rhodorsil 2074 | Irgacure-369 | TMPTGE | TAEICY |
|---|---|---|---|---|
| 13A | 15 pphr | 2.5 pphr | 50 pphr | 25 pphr |
| 13B | — | 2.5 pphr | 50 pphr | 25 pphr |
| 13C | 15 pphr | — | 50 pphr | 25 pphr |
| 13D | 15 pphr | 2.5 pphr | — | 25 pphr |
| 13E | 15 pphr | 2.5 pphr | 50 pphr | — |
| 13F | — | 2.5 pphr | — | 25 pphr |
| 13G | 15 pphr | — | 50 pphr | — |

Each of the seven compositions were separately spin coated on 4" $SiO_2$ wafer by spinning at 650-800 rpm for 30 seconds followed by post apply bake (PAB) at 120° C. for 3 minutes to generate films of 8-10 μm thicknesses. These films were then exposed using a broad band Hg-vapor light source (at 365 nm using a band pass filter) at exposure doses ranging from 0-1500 mJ/$cm^2$ through a mask to generate negative tone images of lines, trenches, pillars and holes. The exposed films were post exposure baked (PEB) at 120° C. for 3 minutes and developed with cyclopentanone immersion for 30-70 seconds. The photo imaging results are summarized in Table 2. The exposure doses listed in Table 2 are the lowest dose that generated good images of holes, pillars, trenches and lines with good integrity such as low residue, no peeling and generally good image appearance for a given composition.

It is apparent from the results summarized in Table 2, the composition Example 13B (no PAG), Example 13D (no epoxy crosslinker, i.e., TMPTGE) and Example 13F (no PAG, no TMPTGE and no acrylate crosslinker) did not form images and the films were completely washed out during cyclopentanone immersion. This demonstrates that at least the presence of a PAG and an epoxy cross linker are essential for photo imaging in accordance with the practice of this invention.

The comparison of composition of Example 13A with composition of Example 13C suggests that the absence of Irgacure-369 in Example 13C deteriorates somewhat the photo imaging performance, contact hole/lines (CH/Lines) resolution in Example 13A being 7/7 vs. 10/7 in Example 13C even though the exposure dose required in Example 13A was higher. This means that composition of Example 13C exhibited faster photo speed when compared with composition of Example 13A. However, use of Irgacure-369 in combination with PAG may provide certain beneficial effects, such as improved image resolution.

The comparison of composition Example 13A with composition Example 13E demonstrates that the presence of the acrylate cross linker (TAEICY) is beneficial to photo imaging. The pillars and lines that would have formed in the bright field area of the mask where the small features are exposed to the 365 nm radiation were completely washed off during cyclopentanone immersion in example 13E where the acrylate cross linker (TAEICY) was absent. The bright field loss (BFL) is 14% even at a substantially higher exposure dose of 1450 mJ/$cm^2$ for Example 13E where TAEICY was absent. This comparative study suggests that some acrylate cross linking may be occurring in exposed areas when TAEICY is present as evidenced in Example 13A which contained TAEICY which resulted well resolved images with essentially no BFL loss of the exposed regions.

Each of the imaged films as summarized in Table 2 were cured at 170° C. for 4 hours in an oven under nitrogen atmosphere. No sign of thermal flow during cure was observed when the images were observed using an optical microscope. The resolution of contact holes (CH) and lines are also summarized in Table 2.

TABLE 2

| Example No. | FT um | Dose mJ/$cm^2$ | Development time, secs | BFL % | Resolution CH/ Lines, μm | Image quality |
|---|---|---|---|---|---|---|
| 13A | 9.74 | 1187 | 70 | 0 | 7/7 | good |
| 13B | 9.62 | — | 30 | 100 | — | — |
| 13C | 8.98 | 608 | 70 | 2 (swell) | 10/7 | good |
| 13D | 9.33 | — | 60 | 100 | — | — |
| 13E | 9.43 | 1450 | 70 | 14 | 15/10 | bad |
| 13F | 9.61 | — | 60 | 100 | — | — |
| 13G | 8.83 | 966 | 70 | 0 | 15/10 | good |

FT—film thickness;
BFL—bright field loss;
CH—contact hole

Thermo-Mechanical Properties

The compositions of Examples 13A, 13C, 13E and 13G were spin coated on 5" $SiO_2$ wafers by spinning at 600-900 rpm for 30 seconds followed by post apply bake (PAB) at 120° C. for 3 minutes to obtain films of thickness in the range of 7-10 μm. The films were then exposed using a broad band Hg-vapor light source (at 365 nm using a band pass filter) at an exposure dose of 1200 mJ/$cm^2$ through a mask to generate film strips of 4.5 mm and 6.5 mm widths followed by a post exposure bake (PEB) at 120° C. for 3 minutes. These films were immersed in cyclopentanone for 60 seconds to reveal the rectangular film strips. These films were cured at 170° C. for 4 hours in an oven under nitrogen atmosphere. The cured film strips were lifted out of the $SiO_2$ wafers by immersing in a dilute (1 wt. %) hydrogen fluoride (HF) solution in water. Film thicknesses before and after cure at 170° C. for 4 hours were measured to determine cure loss as the percentage of the film thickness reduced during this process. Tensile properties were measured using Instron and thermal properties were measured using TMA and TGA. Thermo-mechanical properties of these films are summarized in Table 3. Tensile properties (tensile strength and elongation to break) or glass transition temperature ($T_g$) are not significantly affected by the presence or absence of Irgacure-369 or TAEICY. The cure loss is significantly lower when Irgacure-369 is present. The 5 wt. % loss temperature ($T_{d5}$) during the TGA measurement is significantly higher when Irgacure-369 is present. This data clearly demonstrates that the presence of Irgacure-369 is advantageous to enhance the thermal properties of these films in spite of its adverse effect on the photo speed as demonstrated above.

TABLE 3

| Example No. | Cure loss (%) | Tensile Strength, MPa | ETB (%) | $T_g$ (° C.) | $T_{d5}$ (° C.) |
|---|---|---|---|---|---|
| 13A | 6.9 | 121 | 39 | 194 | 297 |
| 13C | 13.0 | 114 | 29 | 199 | 271 |
| 13E | 8.5 | 119 | 34 | 200 | 289 |
| 13G | 14.8 | 117 | 31 | 196 | 278 |

ETB—elongation to break;
$T_g$—glass transition temperature;
$T_{d5}$—temperature at which the polymer loses 5 wt. % of its mass

Example 14

Photosensitive Compositions—Thermo-Mechanical Properties

The polyimide polymers from Examples 1, 4, 8 and 9 were respectively dissolved in a solvent mixture of GBL/cyclopentanone (3:1 weight ratio) mixture to form a 12 wt. % polymer solution from Example 1 and 13 wt. % polymer solution from each of Examples 4, 8 and 9. Each of these solutions were then mixed with Rhodorsil 2074 as a photo acid generator (15 pphr), Irgacure-369 as a photo radical generator or photo base generator (2.5 pphr), CPTX as the photo-sensitizer (2 pphr), TMPTGE as the epoxy cross linker (50 pphr), TAEICY as the acrylate cross linker (25 pphr), dicumyl peroxide as the thermal radical generator (4 pphr), KBM-403E as the adhesion promoter (5 pphr), FC-4432 as the surface leveling agent (0.3 pphr) and GBL (100 pphr) as extra solvent. The mixtures were rolled for 18 hours to produce homogeneous solutions. Particle contamination was removed by filtering the compositions through a 0.45-1 μm pore polytetrafluoroethylene (PTFE) disc filters. The filtered compositions were collected in low particle HDPE amber bottles and the solutions stored at 5° C. Each of these compositions are then designated as Example 14A (polymer Example 1), Example 14B (polymer Example 4), Example 14C (polymer Example 8) and Example 14D (polymer Example 9).

Photo Imaging Studies

Each of the four composition Examples 14A to 14D as prepared above were spin coated separately onto a 4" $SiO_2$ wafer by spinning at 700-2000 rpm for 30 seconds followed by post apply bake (PAB) at 120° C. for 3 minutes to generate films of 7-8 μm thickness. These films were then exposed using a broad band Hg-vapor light source (at 365 nm using a band pass filter) at an exposure dose ranging from 0-1500 mJ/$cm^2$ through a mask to generate negative tone images of lines, trenches, pillars and holes. The exposed films were post exposure baked (PEB) at 120° C. for 3 minutes and developed with cyclopentanone immersion for 70-210 seconds. Negative tone images of holes, pillars, trenches and lines were formed in each of the photo imaging Examples 14A to 14D having 5-30 μm resolution. The exposure doses reported are the lowest dose that generated good images of holes, pillars, trenches and lines with good integrity such as low residue, no peeling and generally good image appearance for a given composition. The composition Example 14D where the end group was maleic anhydride (MA) did not fully form images even after extended immersion in cyclopentanone since the unexposed areas of the film did not fully dissolve. The photo imaging properties of these examples are summarized in Table 4.

TABLE 4

| Polymer Example No | Composition Ex. No. | End group | FT μm | Dose mJ/$cm^2$ | Development time, seconds | BFL % | Resolution CH/ Lines, μm |
|---|---|---|---|---|---|---|---|
| Example 1 | 14A | None | 7.49 | 765 | 100 | 1% (swell) | 25/10 |
| Example 4 | 14B | $DMMIEtNH_2$ | 7.12 | 1187 | 60 | 0% | 15/5 |
| Example 8 | 14C | $2\text{-}NH_2PhSH$ | 7.34 | 773 | 70 | 0.5% | 20/7 |
| Example 9 | 14D | MA | 4.22 | 765 | 210 | 8% (swell) | 30/5 |

FT—film thickness;
BFL—bright field loss;
CH—contact hole

Thermo-Mechanical Property Studies

Each of the compositions from Examples 14A to 14D were also evaluated for their thermo-mechanical properties. Each of the compositions from Examples 14A to 14D were spin coated on to 5" $SiO_2$ wafers by spinning at 375-700 rpm for 30 seconds followed by post apply bake (PAB) at 120° C. for 3 minutes to generate films in 7-9 μm range. The films were then exposed using a broad band Hg-vapor light source (at 365 nm using a band pass filter) at an exposure dose of 1200 mJ/$cm^2$ through a mask to generate film strips of 4.5 mm and 6.5 mm widths followed by a post exposure bake (PEB) at 120° C. for 3 minutes. These films were immersed in cyclopentanone for 60-150 seconds to reveal the rectangular film strips. As observed before the film formed from the composition Example 14D did not image to form rectangular strips and thus its thermo-mechanical properties could not be measured. The remaining three films were cured at 170° C. for 4 hours in an oven under nitrogen atmosphere. The cured film strips were lifted out of the $SiO_2$ wafers by immersing in a dilute (1 wt. %) hydrogen fluoride (HF) solution in water. Film thicknesses before and after cure at 170° C. for 4 hours were measured to determine cure loss as the percentage of the film thickness reduced during this process. Tensile properties were measured using Instron and thermal properties were measured using TMA and TGA. The measured thermo-mechanical properties of these films are summarized in Table 5. It is apparent from this data that the tensile properties are clearly better when a polyimide is end capped with DMMI or phenyl thiol group, Example 14B and 14C respectively. It appears that DMMI is a better reactive end group than phenyl thiol as an end capped group.

TABLE 5

| Composition Example No. | End group | Cure loss, % | Tensile Strength MPa | Tensile Strength Max, MPa | ETB % | ETB Max, % | $T_g$ ° C. | CTE ppm/K |
|---|---|---|---|---|---|---|---|---|
| 14A | None | 10.9 | 112 | 114 | 10 | 12 | 184 | 49 |
| 14C | 2-$NH_2$PhSH | 7.1 | 121 | 161 | 39 | 83 | 188 | 51 |
| 14B | DMMIEt$NH_2$ | 8.2 | 137 | 211 | 58 | 103 | 193 | 41 |

ETB—elongation to break;
$T_g$—glass transition temperature;
CTE—coefficient of thermal expansion FIG. 1 shows the stress-strain curve obtained from the tensile measurements for the film formed from composition Example 14B, which clearly demonstrates the capability of this invention to produce films having good thermo-mechanical properties even after low temperature cure such as at 170° C., as described herein. Thus the compositions of this invention provide significant processing advantages over the prior art polyimide polymers, which can only be cured at temperatures much above 250° C., and still may not provide much needed thermo-mechanical properties as described herein.

Example 14E

Photosensitive Compositions—Thermo-Mechanical Properties

The polyimide polymer was prepared following the procedures as set forth in Example 4 which exhibited a molecular weight of: PMDA/6FDA/6BF/PFMB/DMMIEt$NH_2$, 24.7/24.7/29/19.1/2.5, $M_w$=126,450, $M_n$=59,950, PD=2.11. The isolated polymer was dissolved in a solvent mixture of GBL/cyclopentanone (3:1 weight ratio) mixture to form a 15 wt. % polymer solution. This solution was then mixed with Rhodorsil 2074 as a photo acid generator (15 pphr), Irgacure-369 as a photo radical generator or photo base generator (2.5 pphr), CPTX as the photo-sensitizer (2 pphr), TMPTGE as the epoxy cross linker (50 pphr), TAEICY as the acrylate cross linker (25 pphr), dicumyl peroxide (DCP) as the thermal radical generator (4 pphr), KBM-403E as the adhesion promoter (5 pphr), FC-4432 as the surface leveling agent (0.3 pphr) and GBL (300 pphr) as extra solvent. The mixture was rolled for 18 hours to produce a homogeneous solution. Particle contamination was removed by filtering the composition through a 1 μm pore polytetrafluoroethylene (PTFE) cartridge filter 6 times. The filtered composition was collected in low particle HDPE amber bottles and the solution stored at 5° C.

Photo Imaging Studies

Figure 4:
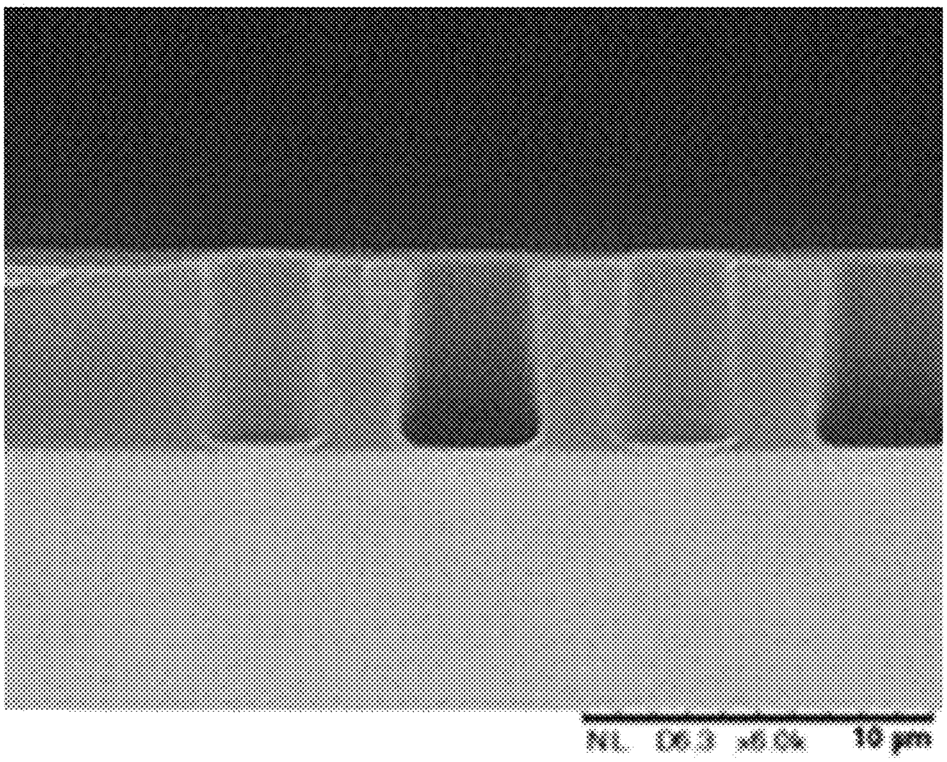
FIG. 4 and FIG. 5 show scanning electron micrographic (SEM) images formed from two different composition embodiments of this invention.

The composition of Example 14E was spin coated onto a $SiO_2$ wafer by spinning at 800 rpm for 30 seconds followed by post apply bake (PAB) at 120° C. for 3 minutes to generate a film of 5-7 μm thickness. This film was then exposed using a broad band Hg-vapor light source (at 365 nm using a band pass filter) at an exposure dose ranging from 400-800 mJ/$cm^2$ through a mask to generate negative tone images of lines, trenches, pillars and holes. The exposed film was post exposure baked (PEB) at 120° C. for 3 minutes and spray developed with cyclopentanone for 30 seconds followed by propylene glycol methyl ether acetate (PGMEA) for 10 seconds. Negative tone images of holes, pillars, trenches and lines were formed in 3-7 μm resolution. FIG. 4 shows a SEM cross-sectioned image of hole pattern of Example 14E at 3 μm resolution at 700 mJ/$cm^2$ exposure dose. It is apparent from FIG. 4 that the composition of Example 14E exhibits superior image resolution than that of the composition of Example 14B where a slight modification of the molecular weight of the base polymer as used herein. It should further be noted that as demonstrated herein the compositions of this invention provide not only significant improvements in image resolution but also other property advantages over the prior art polyimide polymers.

Thermo-Mechanical Property Studies

Composition from Example 14E was also evaluated for its thermo-mechanical properties. Films of this composition was generated in 7-9 μm range. The films were then exposed using a broad band Hg-vapor light source (at 365 nm using a band pass filter) at an exposure dose of 1000 mJ/$cm^2$ followed by a post exposure bake (PEB) at 120° C. for 3 minutes. Then the films were cured at 170° C. for 4 hours in an oven under nitrogen atmosphere, diced into rectangular film strips and lifted out of the wafers by immersing in 1 wt. % HF solution in water. Cure loss was calculated as a percentage by measuring film thicknesses before and after the cure step. Tensile properties were measured using Instron and thermal properties were measured using TMA and TGA. The measured thermo-mechanical properties of these films are summarized in Table 6 which clearly demonstrates the capability of this invention to produce films having good thermo-mechanical properties even after low temperature cure such as at 170° C., as described herein. Thus the compositions of this invention provide significant processing advantages over the prior art polyimide polymers, which can only be cured at temperatures much above 250° C., and still may not provide much needed thermo-mechanical properties as described herein.

TABLE 6

| Property | Example 14E |
|---|---|
| ETB, % | 91% |
| Tensile Strength, MPa | 161 |
| Young's Modulus, GPa | 3.16 |
| $T_g$, ° C. | 183 |
| $T_{d5}$, ° C. | 266 |

TABLE 6-continued

| Property | Example 14E |
|---|---|
| CTE, ppm/K | 65 |
| Cure loss, % | 7.2 |
| Dk (at 10 GHz) | 3.15 |
| Df (at 10 GHz) | 0.018 |

ETB—elongation to break;
$T_g$—glass transition temperature;
CTE—coefficient of thermal expansion,
Dk—dielectric constant,
Df—dielectric loss

Example 15

Photosensitive Compositions—Thermo-Mechanical Properties

Isolated polyimide polymer from Example 6 was dissolved in a solvent mixture of GBL/cyclopentanone (3:1 weight ratio) to form 13 wt. % solution. This solution was then mixed with Rhodorsil 2074 as a photo acid generator (15 pphr), Irgacure-369 as a photo radical generator (2.5 pphr), CPTX as the photo-sensitizer (2 pphr), TAEICY as the acrylate cross linker (25 pphr), dicumyl peroxide (DCP) as the thermal radical generator (4 pphr), KBM-403E as the adhesion promoter (5 pphr), FC-4432 as the surface leveling agent (0.3 pphr) and GBL (100 pphr) as extra solvent. Two separate compositions were made using this as a base composition and mixing with either TMPTGE or Denacol EX 614B as epoxy cross linkers and the amounts of these epoxy cross linkers are given in Table 7. The compositions thus formed were then rolled for 18 hours to produce homogeneous solutions. Particle contamination was removed by filtering the formulations through a 0.45-1 μm pore polytetrafluoroethylene (PTFE) disc filters. The filtered formulations were collected in low particle HDPE amber bottles and the solutions stored at 5° C.

TABLE 7

| Composition Ex No. | TMPTGE | Denacol EX 614B |
|---|---|---|
| 15A | 50 pphr | — |
| 15B | 40 pphr | 10 pphr |

Photo Imaging Studies

Each of the composition Examples 15A and 15B were spin coated separately on to a 4" $SiO_2$ wafer by spinning at 400-600 rpm for 30 seconds followed by post apply bake (PAB) at 120° C. for 3 minutes to generate films of 8-11 μm thicknesses. These films were then exposed using a broad band Hg-vapor light source (at 365 nm using a band pass filter) at an exposure dose ranging from 0-1500 mJ/cm$^2$ through a mask to generate negative tone images of lines, trenches, pillars and holes. The exposed films were post exposure baked (PEB) at 120° C. for 3 minutes and developed with cyclopentanone immersion for 70-100 seconds. Negative tone images of holes, pillars, trenches and lines were formed for both formulation. The exposure doses reported are the lowest dose that generated good images of holes, pillars, trenches and lines with good integrity such as low residue, no peeling and generally good image appearance for a given composition. The photo imaging properties of these examples are summarized in Table 8.

TABLE 8

| Composition Example No. | FT μm | Dose mJ/cm$^2$ | Development time, seconds | BFL % | Resolution CH/lines, μm |
|---|---|---|---|---|---|
| 15A | 5.54 | 526 | 70 | 3% | 7/5 |
| 15B | 7.69 | 765 | 60 | 0.4% | 7/5 |

FT—film thickness;
BFL—bright field loss;
CH—contact hole

Thermo-Mechanical Property Studies

Each of the composition Examples 15A and 15B were spin coated on to 5" $SiO_2$ wafers by spinning at 400-1100 rpm for 30 seconds followed by post apply bake (PAB) at 120° C. for 3 minutes to generate films in 13-15 μm range. The films were then exposed using a broad band Hg-vapor light source (at 365 nm using a band pass filter) at an exposure dose of 1200 mJ/cm$^2$ through a mask to generate film strips of 4.5 mm and 6.5 mm widths followed by a post exposure bake (PEB) at 120° C. for 3 minutes. These films were immersed in cyclopentanone for 60-150 seconds to reveal the rectangular film strips. These films were cured at 170° C. for 4 hours in an oven under nitrogen atmosphere. The cured film strips were lifted out of the $SiO_2$ wafers by immersing in a dilute (1 wt. %) hydrogen fluoride (HF) solution in water. Film thicknesses before and after cure at 170° C. for 4 hours were measured to determine cure loss as the percentage of the film thickness reduced during this process. Tensile properties were measured using Instron and thermal properties were measured using TMA and TGA. Thermo-mechanical properties of these films are summarized in Table 9.

TABLE 9

| Composition Example No. | Cure loss % | Tensile Strength MPa | Tensile Strength Max, MPa | ETB % | ETB Max, % | $T_g$ ° C. | CTE ppm/K |
|---|---|---|---|---|---|---|---|
| 15A | 8.0 | 127 | 178 | 32 | 91 | 190 | 42 |
| 15B | 7.9 | 134 | 174 | 48 | 73 | 202 | 30 |

ETB—elongation to break;
$T_g$—glass transition temperature;
CTE—coefficient of thermal expansion It is apparent from the data summarized in Tables 8 and 9, the composition of Example 15 generally exhibits superior thermo-mechanical properties than that of the composition of Example 14A or Example 14C by slight modification of the polymer composition as used herein. The thermo-mechanical properties of Example 15 are comparable to that of Example 14B. Further, the composition of Example 15 exhibited better photo imaging resolution (7μ contact holes (CH)) than that of compositions of Examples 14A to 14C (15-30 μm CH) and overall improved thermo-mechanical properties as summarized in Table 8.

Example 16

Photosensitive Compositions—Thermo-Mechanical Properties

Four compositions were made from isolated polyimide polymer from Example 5, Examples 16A to 16D, two compositions from polymer Example 11, Examples 16E and 16F, and one composition from polymer Example 2, Example 16G were made as follows. Each of the polymer from the above examples were dissolved in a solvent mixture of GBL/cyclopentanone (3:1 weight ratio) to form 14-15 wt. % solutions. These solutions were mixed with Rhodorsil 2074 as a photo acid generator (15 pphr), Irgacure-369 as a photo radical generator (2.5 pphr), CPTX as the photo-sensitizer (2 pphr), dicumyl peroxide (DCP) as the thermal radical generator (4 pphr), KBM-403E as the adhesion promoter (5 pphr), FC-4432 as the surface leveling agent (0.3 pphr) and GBL (100 pphr) as extra solvent. TAEICY was used as the acrylate cross linker. TMPTGE, Denacol EX 946L and Denacol EX 614B were used as epoxy cross linkers and the amounts of these cross linkers used in each of these examples are summarized in Table 10. The compositions thus formed were then rolled for 18 hours to produce homogeneous solutions. Particle contamination was removed by filtering the formulations through a 0.45-1 μm pore polytetrafluoroethylene (PTFE) disc filters. The filtered formulations were collected in low particle HDPE amber bottles and the solutions stored at 5° C.

TABLE 10

| Polymer Example No. | Composition Example No. | TAEICY pphr | TMPTGE pphr | Denacol EX 614B, pphr | Denacol EX 946L, pphr |
|---|---|---|---|---|---|
| 5 | 16A | 25 | 50 | — | — |
| 5 | 16B | — | 50 | — | — |
| 5 | 16C | 25 | 40 | 10 | — |
| 5 | 16D | 25 | 40 | — | 10 |
| 11 | 16E | 25 | 50 | 10 | — |
| 11 | 16F | 25 | 50 | 20 | — |
| 2 | 16G | 25 | 40 | 10 | — |

Photo Imaging Studies

Each of the seven compositions as formed above were spin coated separately on to a 4" $SiO_2$ wafer by spinning at 600-700 rpm for 30 seconds followed by post apply bake (PAB) at 120° C. for 3 minutes to generate films of 5-8 μm thicknesses. These films were then exposed using a broad band Hg-vapor light source (at 365 nm using a band pass filter) at an exposure doses ranging from 0-1500 mJ/$cm^2$ through a mask to generate negative tone images of lines, trenches, pillars and holes. The exposed films were post exposure baked (PEB) at 120° C. for 3 minutes and developed with cyclopentanone immersion for 60 seconds. Negative tone images of holes, pillars, trenches and lines were formed for both formulation. The exposure doses reported are the lowest dose that generated good images of holes, pillars, trenches and lines with good integrity such as low residue, no peeling and generally good image appearance for a given composition. Images in the case of composition Example 16B where the acrylate cross linker TAEICY is absent had excessive peeling and needed a higher dose than other films to obtain images. This is similar to that observed in the photo imaging of example 13E where the acrylate cross linker TAEICY was absent. These imaged films were then subjected to a cure step at 170° C. for 4 hours in an oven under nitrogen atmosphere. The extent of the thermal flow was evaluated as the deformation of the best contact hole (CH) feature after the cure step using an optical and laser microscope. If no discernable change in the lowest contact hole was observed the thermal flow was deemed to be low. Bright field losses for Examples 16C to 16F were not measured but deemed to be less than 10% since the final film thicknesses after the cure step was less than 15% of the original film thickness and the film thickness loss during the cure step measured separately for these formulations ranged from 6-9%. The total film thickness was calculated as the percentage film thickness loss after development and cure step compared to the original film thickness. The photo imaging properties of these examples are summarized in Table 11.

TABLE 11

| Composition Example No. | FT μm | Dose mJ/$cm^2$ | BFL % | Resolution CH/lines, μm | Thermal flow | Total FT loss, % |
|---|---|---|---|---|---|---|
| 16A | 7.54 | 765 | 2% | 7/5 | | |
| 16B | 6.62 | 1187 | 0.5% | 10/5 | | |
| 16C | 7.16 | 765 | — | 7/5 | Low | 13.8 |
| 16D | 5.43 | 491 | — | 7/5 | Low | 12.2 |
| 16E | 5.31 | 491 | — | 5/5 | Low | 10.5 |
| 16F | 5.02 | 491 | — | 5/5 | Low | 5.60 |
| I6G | 8.02 | 966 | 0% | 10/5 | low | 9.20 |

FT—film thickness;
BFL—bright field loss;
CH—contact hole

Figure 2:
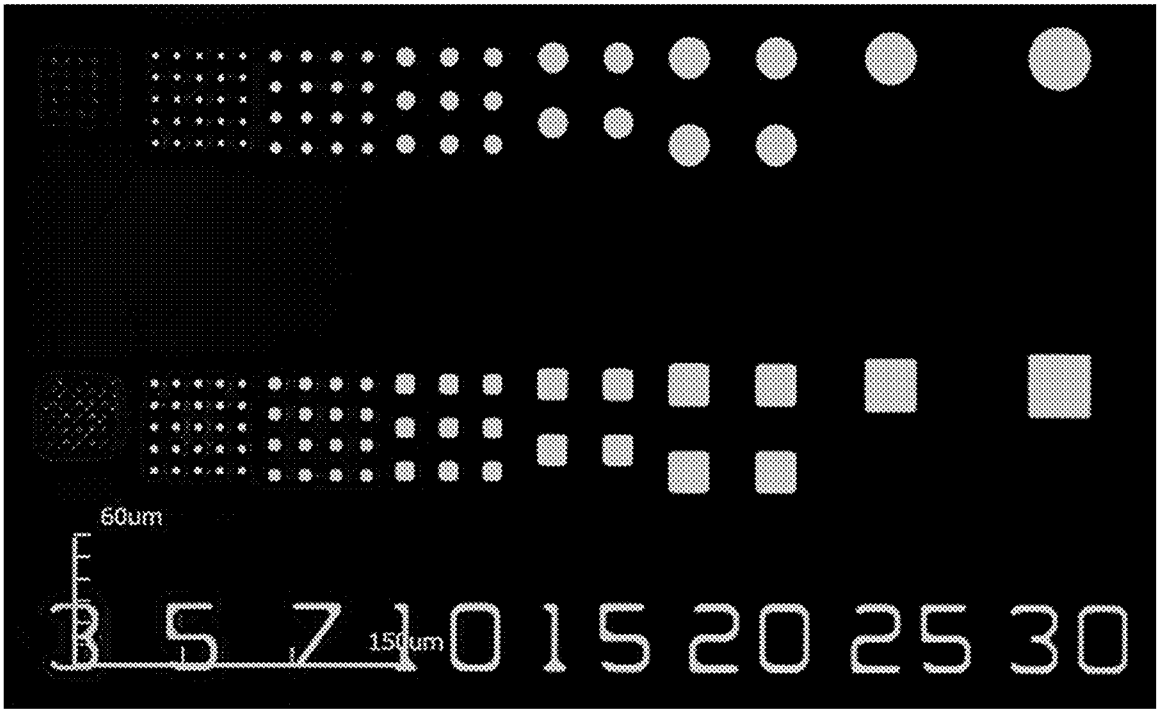
FIG. 2 shows laser micrograph images formed from a composition embodiment of this invention.

FIG. 2 shows laser microscope generated top-down image of contact hole patterns of photo imaging obtained from the composition of Example 16C, which shows 5-7 μm resolution of both square and round contact holes.

Figure 3:
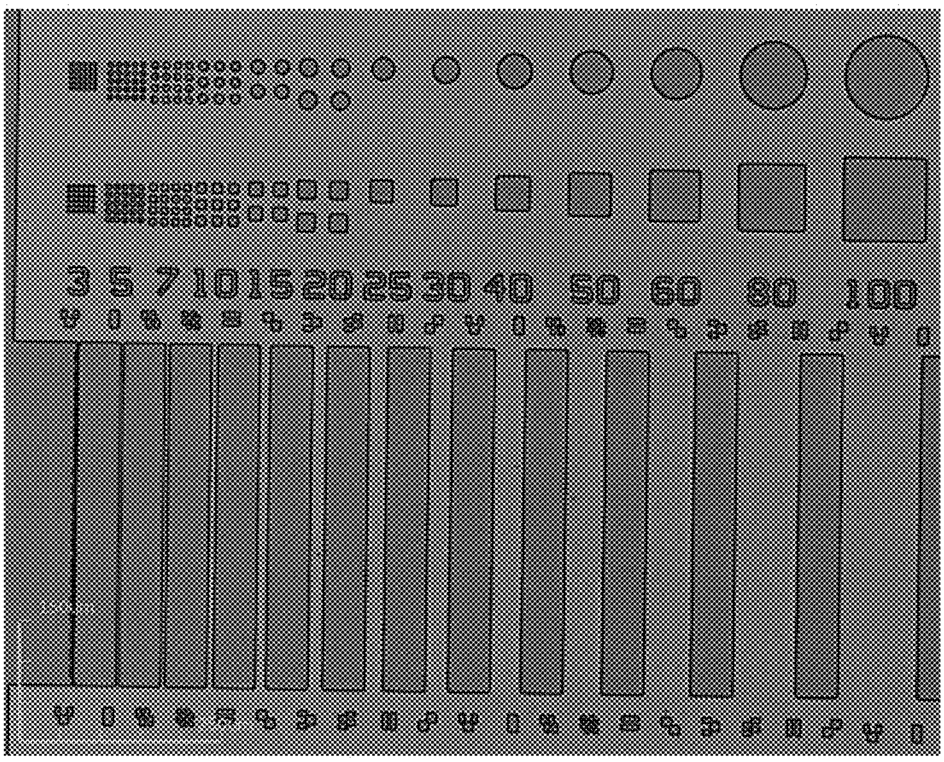
FIG. 3 shows photolithographic images formed from a composition embodiment of this invention.

FIG. 3 shows optical microscope generated top down images of contact holes and lines resolution at 5 μm from the photo imaging obtained from the composition of Example 16E after the cure step at 170° C. for 4 hrs.

Thermo-Mechanical Property Evaluations

Each of the seven compositions from Examples 16A to 16G were spin coated separately on to a 5" $SiO_2$ wafer by spinning at 400-1100 rpm for 30 seconds followed by post apply bake (PAB) at 120° C. for 3 minutes to generate films in 6-13 μm range. The films were then exposed using a broad band Hg-vapor light source (at 365 nm using a band pass filter) at an exposure dose of 1200 mJ/$cm^2$ through a mask to generate film strips of 4.5 mm and 6.5 mm widths followed by a post exposure bake (PEB) at 120° C. for 3 minutes. These films were immersed in cyclopentanone for 60-90 seconds to reveal the rectangular film strips. These films were cured at 170° C. for 4 hours in an oven under nitrogen atmosphere. The cured film strips were lifted out of the $SiO_2$ wafers by immersing in a dilute (1 wt. %) hydrogen fluoride (HF) solution in water. Film thicknesses before and after cure at 170° C. for 4 hours were measured to determine cure loss as the percentage of the film thickness reduced during this process. Tensile properties were measured using Instron and thermal properties were measured using TMA and TGA. Thermo-mechanical properties of these films are summarized in Table 12.

TABLE 12

| Composition Example No. | Cure loss % | Tensile Strength, MPa | Tensile Strength Max, MPa | ETB % | ETB Max, % | $T_g$ ° C. | CTE ppm/K |
|---|---|---|---|---|---|---|---|
| 16A | 5.9 | 125 | 167 | 51 | 79 | 202 | 30 |
| 16B | 7.5 | 115 | 137 | 29 | 60 | — | — |
| 16C | 6.0 | 123 | 164 | 54 | 87 | 189 | 23 |
| 16D | 8.9 | 115 | 155 | 48 | 89 | 189 | 32 |
| 16E | 5.9 | 118 | 155 | 49 | 80 | 186 | 43 |
| 16F | 7.3 | 96 | 100 | 24 | 43 | 185 | 52 |
| 16G | 9.1 | 114 | 135 | 51 | 79 | 190 | 39 |

ETB—elongation to break;
$T_g$—glass transition temperature;
CTE—coefficient of thermal expansion

Example 17

Photosensitive Compositions

Two compositions were prepared from isolated polyimide from Example 12, composition Examples 17A and 17B, two compositions were made from isolated polyimide from Example 10, composition Examples 17C and 17D, and two compositions were made from polymer Example 3, composition Examples 17E and 17F as follows. Each of the six polymer samples as noted above were dissolved in a solvent mixture of GBL/cyclopentanone (3:1 weight ratio) to form 13-15 wt. % solutions. These solutions were mixed with Rhodorsil 2074 as a photo acid generator (15 pphr), Irgacure-369 as a photo radical generator (2.5 pphr), CPTX as the photo-sensitizer (2 pphr), TMPTGE as the epoxy cross linker (50 pphr), TAEICY as the acrylate cross linker (25 pphr), dicumyl peroxide (DCP) as the thermal radical generator (4 pphr), KBM-403E as the adhesion promoter (5 pphr), FC-4432 as the surface leveling agent (0.3 pphr) and GBL (100 pphr) as extra solvent. SIT7908.0 as an additional adhesion promoter (3 pphr) was used in composition Examples 17B, 17D, and 17F. The mixtures were rolled for 18 hours to produce homogeneous solutions. Particle contamination was removed by filtering the formulations through a 0.45-1 μm pore polytetrafluoroethylene (PTFE) disc filters. The filtered formulations were collected in low particle HDPE amber bottles and the solutions stored at 5° C.

Photo Imaging Studies

Each of the above formed composition Examples 17A to 17F were spin coated separately on to a 4" $SiO_2$ wafer by spinning at 500-800 rpm for 30 seconds followed by post apply bake (PAB) at 120° C. for 3 minutes to generate films of 4-7 μm thicknesses. The films in composition Examples 17C and 17D were post apply baked at 100° C. for 3 minutes each. These films were then exposed using a broad band Hg-vapor light source (at 365 nm using a band pass filter) at an exposure doses ranging from 0-1500 mJ/cm$^2$ through a mask to generate negative tone images of lines, trenches, pillars and holes. The exposed films were post exposure baked (PEB) at 120° C. for 3 minutes (100° C. for 2 minutes for the films of composition Examples 17C and 17D) and developed with cyclopentanone immersion for 60 seconds. Negative tone images of holes, pillars, trenches and lines were formed for both formulations. The exposure doses reported are the lowest dose that generated good images of holes, pillars, trenches and lines with good integrity such as low residue, no peeling and generally good image appearance for a given composition. The photo imaging results are summarized in Table 13. It is evident form this data that the resolutions of contact holes (CH) are better when the additive SIT7908.0 is used.

TABLE 13

| Composition Example No. | FT μm | Dose mJ/cm$^2$ | BFL % | Resolution μm |
|---|---|---|---|---|
| 17A | 4.72 | 966 | 5.7 | 20 |
| 17B | 5.19 | 765 | 1.2 | 5 |
| 17C | 6.30 | 491 | 1.0 (swell) | 15 |
| 17D | 6.78 | 491 | 10.0 | 7 |
| 17E | 5.75 | 491 | 1.0 | 15 |
| 17F | 5.69 | 491 | 3.0 | 10 |

FT—film thickness;
BFL—bright field loss;
CH—contact hole

Example 18

Photosensitive Composition

Isolated polyimide from Example 7A was dissolved in a solvent mixture of GBL/cyclopentanone (3:1 weight ratio) to form 15 wt. % solution. This solution was then mixed with Rhodorsil 2074 as a photo acid generator (15 pphr), Irgacure-369 as a photo radical generator (2.5 pphr), CPTX as the photo-sensitizer (2 pphr), TMPTGE as the epoxy cross linker (50 pphr), dicumyl peroxide (DCP) as the thermal radical generator (4 pphr), KBM-403E as the adhesion promoter (5 pphr), SIT7908.0 as the adhesion promoter (3 pphr), FC-4432 as the surface leveling agent (0.3 pphr) and GBL (100 pphr) as extra solvent. The mixture was rolled for 18 hours to produce homogeneous solution. Particle contamination was removed by filtering the formulations through a 0.20 μm pore polytetrafluoroethylene (PTFE) disc filters. The filtered formulation was collected in low particle HDPE amber bottle and the solution was stored at 5° C.

Photo Imaging Studies

The composition thus formed above was spin coated on 4" $SiO_2$ wafer by spinning at 600 rpm for 30 seconds followed by post apply bake (PAB) at 120° C. for 3 minutes to generate a film having a thickness of about 6.52 μm. This film was then exposed using a broad band Hg-vapor light source (at 365 nm using a band pass filter) at an exposure dose of 765 mJ/cm$^2$ through a mask to generate negative tone images of lines, trenches, pillars and holes. The exposed film was post exposure baked (PEB) at 120° C. for 3 minutes and developed with cyclopentanone immersion for 60 seconds. Negative tone images of holes, pillars, and lines were formed at 7 μm resolution. The film thickness of the developed film was 6.41 μm indicating about 2% bright field loss (BFL) had occurred.

Example 19

Photosensitive Composition

Isolated polyimide from Example 7B was dissolved in a solvent mixture of GBL/cyclopentanone (3:1 weight ratio) to form 15 wt. % solution. This solution was then mixed with Rhodorsil 2074 as a photo acid generator (15 pphr), Irgacure-369 as a photo radical generator (2.75 pphr), CPTX as the photo-sensitizer (2 pphr), PEGE as the epoxy cross linker (35 pphr), Denacol EX 614B as the epoxy cross linker (10 pphr), A-TMM as the acrylate cross linker (20 pphr), dicumyl peroxide (DCP) as the thermal radical generator (3 pphr), KBM-403E as the adhesion promoter (5 pphr), FC-4432 as the surface leveling agent (0.3 pphr) and GBL (300 pphr) as extra solvent. The mixture was rolled for 18 hours to produce homogeneous solution. Particle contamination was removed by filtering the formulations through a 1 μm pore polytetrafluoroethylene (PTFE) disc filters. The filtered formulation was collected in low particle HDPE amber bottle and the solution was stored at 5° C.

Photo Imaging Studies

The composition thus formed above was spin coated on 4" $SiO_2$ wafer by spinning at 800 rpm for 30 seconds followed by post apply bake (PAB) at 120° C. for 3 minutes to generate a film having a thickness of about 5.44 μm. This film was then exposed using a broad band Hg-vapor light source (at 365 nm using a band pass filter) at an exposure dose of 510 mJ/cm$^2$ through a mask to generate negative tone images of lines, trenches, pillars and holes. The exposed film was post exposure baked (PEB) at 120° C. for 3 minutes and developed with cyclopentanone immersion for 60 seconds. Negative tone images of holes, pillars and lines were formed at 10-15 μm resolution.

Thermo-Mechanical Property Evaluations

The composition from Examples 19 was spin coated separately on to a 4" bare Si wafer by spinning at 450 rpm for 30 seconds followed by post apply bake (PAB) at 120° C. for 3 minutes to generate an 8.39 μm film. This film was then exposed using a broad band Hg-vapor light source (at 365 nm using a band pass filter) at an exposure dose of 1000 mJ/cm$^2$ followed by a post exposure bake (PEB) at 120° C. for 3 minutes. This film was cured at 170° C. for 4 hours in an oven under nitrogen atmosphere. The film thickness of the cured film was 8.23 μm with 1.9% cure film thickness loss. The cured film was lifted out of the wafer by immersing in a dilute (1 wt. %) hydrogen fluoride (HF) solution in water and diced into about 1 cm wide rectangular films. Thermal properties were measured using TMA, DMA and TGA. Thermo-mechanical properties of this film are summarized in Table 14.

Example 20

Photosensitive Composition

Isolated polyimide from Example 7C was dissolved in a solvent mixture of GBL/cyclopentanone (3:1 weight ratio) to form 15 wt. % solution. This solution was then mixed with Rhodorsil 2074 as a photo acid generator (7.50 pphr), Irgacure-369 as a photo radical generator (1.0 pphr), CPTX as the photo-sensitizer (2 pphr), PEGE as the epoxy cross linker (50 pphr), A-TMM as the acrylate cross linker (25 pphr), dicumyl peroxide (DCP) as the thermal radical generator (3 pphr), KBM-403E as the adhesion promoter (5 pphr), FC-4432 as the surface leveling agent (0.3 pphr) and GBL (300 pphr) as extra solvent. The mixture was rolled for 18 hours to produce homogeneous solution. Particle contamination was removed by filtering the formulations through a 1 μm pore polytetrafluoroethylene (PTFE) disc filters. The filtered formulation was collected in low particle HDPE amber bottle and the solution was stored at 5° C.

Photo Imaging Studies

The composition thus formed above was spin coated on 4" $SiO_2$ wafer by spinning at 600 rpm for 30 seconds followed by post apply bake (PAB) at 120° C. for 3 minutes to generate a film having a thickness of about 5.31 μm. This film was then exposed using a broad band Hg-vapor light source (at 365 nm using a band pass filter) at an exposure dose of 644 mJ/cm$^2$ through a mask to generate negative tone images of lines, trenches, pillars and holes. The exposed film was post exposure baked (PEB) at 120° C. for 3 minutes and developed with cyclopentanone immersion for 60 seconds. Negative tone images of holes, pillars and lines were formed at 10-15 μm resolution.

Thermo-Mechanical Property Evaluations

The composition from Examples 20 was spin coated separately on to a 4" bare Si wafer by spinning at 375 rpm for 30 seconds followed by post apply bake (PAB) at 120° C. for 3 minutes to generate a 7.69 μm film. This film was then exposed using a broad band Hg-vapor light source (at 365 nm using a band pass filter) at an exposure dose of 1000 mJ/cm$^2$ through a mask to generate film strips of 4.5 mm and 6.5 mm widths followed by a post exposure bake (PEB) at 120° C. for 3 minutes. This film was cured at 170° C. for 4 hours in an oven under nitrogen atmosphere. The film thickness of the cured film was 7.35 μm with 4.4% cure film thickness loss. The cured film was lifted out of the wafer by immersing in a dilute (1 wt. %) hydrogen fluoride (HF) solution in water and diced into about 1 cm wide rectangular films. Thermal properties were measured using TMA, DMA and TGA. Thermo-mechanical properties of this film are summarized in Table 14.

TABLE 14

| Property | Example 19 | Example 20 |
|---|---|---|
| Cure Loss, % | 1.9 | 4.4 |
| $T_g$ (TMA, ° C.) | 233 | 213 |
| CTE (ppm/K) | 49 | 64 |
| $T_{d5}$ (TGA, ° C.) | 286 | 266 |
| Tan δ (DMA, ° C.) | 323 | 308 |
| Storage Modulus (DMA, at 30° C., GPa) | 2.7 | — |
| Storage Modulus (DMA, at 200° C., GPa) | 1.3 | — |

Example 21

Photosensitive Composition

Isolated polyimide from Example 5 was dissolved in a solvent mixture of GBL/cyclopentanone (3:1 weight ratio) to form 15 wt. % solution. This solution was then mixed with Rhodorsil 2074 as a photo acid generator (15 pphr), Irgacure-369 as a photo radical generator (2.50 pphr), CPTX as the photo-sensitizer (2 pphr), TMPTGE as the epoxy cross linker (50 pphr), TAEICY as the acrylate cross linker (25 pphr), dicumyl peroxide (DCP) as the thermal radical generator (4 pphr), KBM-403E as the adhesion promoter (5 pphr), FC-4432 as the surface leveling agent (0.3 pphr) and GBL (200 pphr) as extra solvent. The mixture was rolled for 18 hours to produce homogeneous solution. Particle contamination was removed by filtering the formulations through a 1 μm pore polytetrafluoroethylene (PTFE) disc filters. The filtered formulation was collected in low particle HDPE amber bottle and the solution was stored at 5° C.

Photo Imaging Studies

Figure 5:
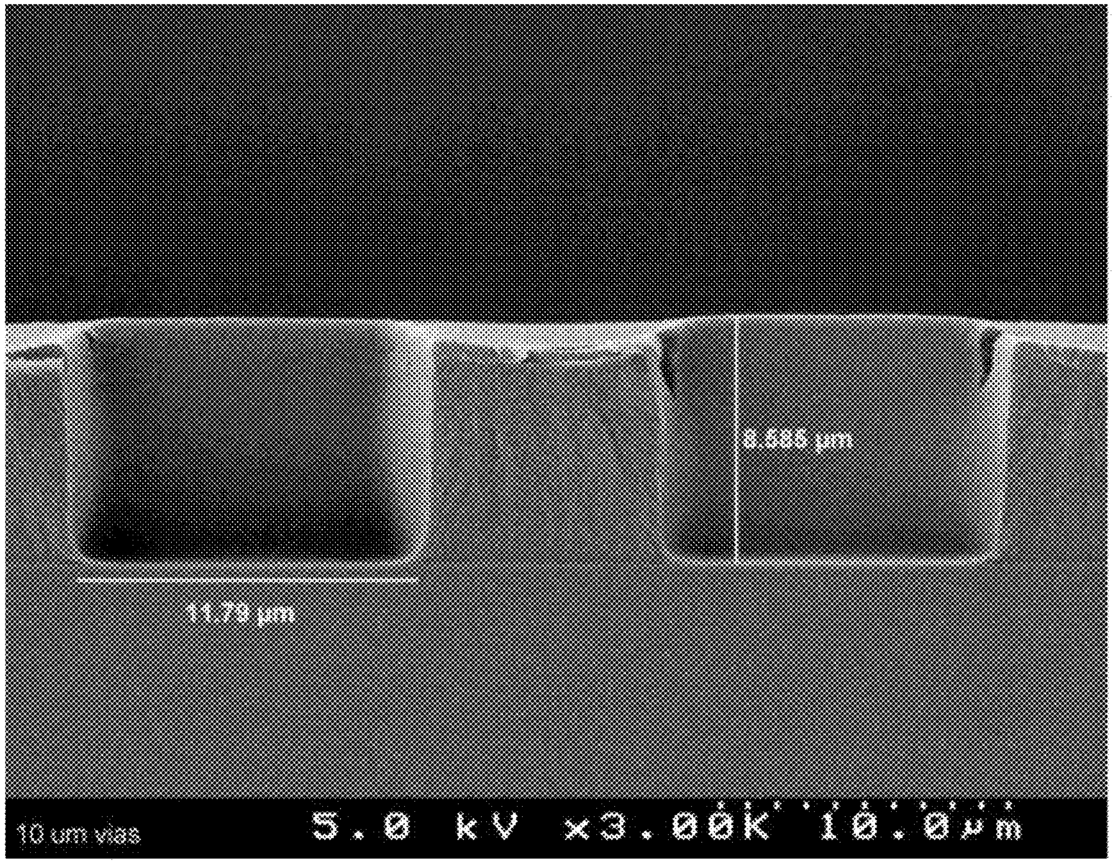

The composition thus formed above was spin coated on 4" $SiO_2$ wafer by spinning at 500 rpm for 30 seconds followed by post apply bake (PAB) at 120° C. for 3 minutes to generate a film having a thickness of 9.28 μm. This film was then exposed using a broad band Hg-vapor light source (at 365 nm using a band pass filter) at an exposure dose range of 300-500 mJ/cm$^2$ through a mask to generate negative tone images of lines, trenches, pillars and holes. The exposed film was post exposure baked (PEB) at 120° C. for 3 minutes and developed with cyclopentanone immersion for 90 seconds. The resulting film thickness at exposed area was 9.17 μm having about 1% film thickness loss during the development with cyclopentanone. Negative tone images of holes, pillars, and lines were formed at 5-10 μm resolution. This imaged film was cured at 170° C. for 4 hours in an oven under nitrogen atmosphere. The resulting film thickness was 8.47 μm having about 8% cure loss. FIG. 5 shows a SEM cross-sectioned image of hole pattern of Example 21 after the cure step at 10 μm resolution at 700 mJ/cm$^2$ exposure dose.

Example 22

Photosensitive Composition

Isolated polyimide polymer prepared using the procedure as set forth in Example 3 except for using tetrahydrofuran (THF) as the solvent (6FDA/PMDA/6BF/PFMB/DMMI-$EtNH_2$, 24.7/24.7/29.0/19.1/2.5, $M_w$=165,600, $M_n$=78900, PD=2.1) was dissolved in a solvent mixture of GBL/cyclopentanone (3:1 weight ratio) to form 15 wt. % solution. This solution was then mixed with Rhodorsil 2074 as a photo acid generator (15 pphr), Irgacure-369 as a photo radical generator (2.5 pphr), CPTX as the photo-sensitizer (2 pphr), BTMPTA as the acrylate cross linker (25 pphr), dicumyl peroxide (DCP) as the thermal radical generator (4 pphr), KBM-403E as the adhesion promoter (5 pphr), FC-4432 as the surface leveling agent (0.3 pphr) and GBL (300 pphr) as extra solvent. TMPTGE, PEGE, Denacol EX 614B, VG3101L and Cardo Epoxy were added as epoxy cross linkers (50 pphr each) to examples 22A, 22B, 22C, 22D and 22E respectively. The mixtures were rolled for 18 hours to produce homogeneous solutions. Particle contamination was removed by filtering the formulations through a 1 μm pore polytetrafluoroethylene (PTFE) disc filters. The filtered formulations were collected in low particle HDPE amber bottle and the solutions were stored at 5° C.

Thermo-Mechanical Property Evaluations

The composition from Examples 22A, 22B, 22C, 22D and 22E were spin coated separately on to 4" bare Si wafers by spinning at 350-400 rpm for 30 seconds followed by post apply bake (PAB) at 120° C. for 3 minutes to generate a 7-10 μm thick films. These films were then exposed using a broad band Hg-vapor light source (at 365 nm using a band pass filter) at an exposure dose of 1000 mJ/cm$^2$ followed by a post exposure bake (PEB) at 120° C. for 3 minutes. The films were cured at 170° C. for 4 hours in an oven under nitrogen atmosphere. The cured films were lifted out of the wafer by immersing in a dilute (1 wt. %) hydrogen fluoride (HF) solution in water and diced into about 1 cm wide rectangular films. Thermal properties were measured using TMA, DMA and TGA. Thermal properties of these films are summarized in Table 15.

TABLE 15

| | Composition Example # | | | | |
|---|---|---|---|---|---|
| | 22A | 22B | 22C | 22D | 22E |
| Epoxy cross linker | TMPTGE | PEGE | Denacol EX 614B | VG3101L | Cardo Epoxy |
| $T_g$ (TMA, ° C.) | 184 | 191 | 200 | 220 | 226 |
| CTE (ppm/K) | 65 | 71 | 65 | 50 | 60 |
| $T_{d5}$ (TGA, ° C.) | 242 | 245 | 248 | 299 | 291 |
| Tan δ (DMA, ° C.) | 208 | 214 | 239 | 250 | 262 |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A process for forming a patterned film comprising:

a) forming an organic solvent soluble end capped polyimide of formula (IA):

(IA)

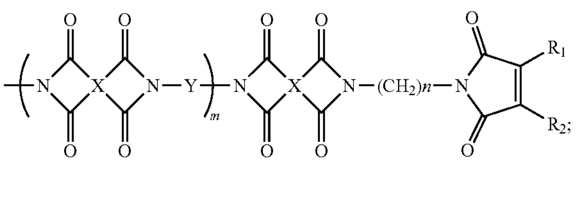

wherein:

m is an integer of at least 50;

n is an integer from 1 to 12, inclusive;

X is derived from one or more dianhydrides selected from the group consisting of:

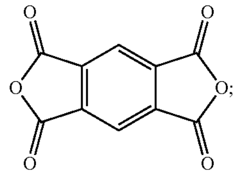

and 1H,3H-benzo[1,2-c:4,5-c']-difuran-1,3,5,7-tetraone (PMDA)

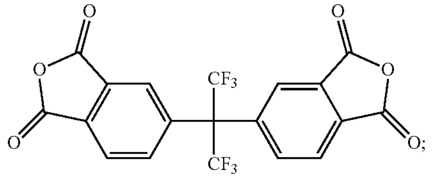

5,5'-(perfluoropropane-2,2-diyl)bis(isobenzofuran-1,3-dione) (6FDA)

Y is derived from one or more diamines selected from the group consisting of:

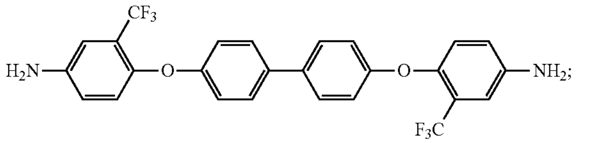

4,4'-([1,1'-biphenyl]-4,4'-diylbis(oxy))bis(3-trifluoromethyl)aniline) (6BF)

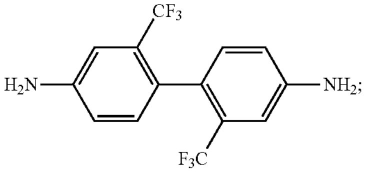

2,2'-bis(trifluoromethyl)-[1,1'-biphenyl]-4,4'-diamine (PFMB)

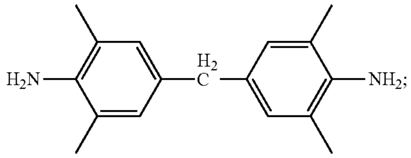

4,4'-methylenebis(2,6-dimethylaniline) (DO3)

$R_1$ and $R_2$ are the same or different and each independently of one another selected from the group consisting of hydrogen and linear or branched ($C_1$-$C_{16}$) alkyl;

by reacting the one or more dianhydrides, the one or more diamines, and a compound of formula (II):

(II)

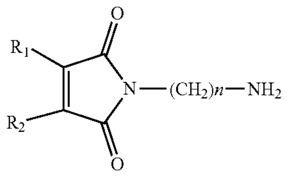

in N-methyl-2-pyrrolidone at ambient temperature to form a polyamic acid solution;

mixing the polyamic acid solution with cyclopentanone, acetic anhydride and pyridine, and heating the mixture at a temperature of about 95° C. for about six hours in nitrogen atmosphere; and cooling to obtain the polyimide of formula (IA), wherein the polyimide of formula (IA) is soluble in an organic solvent selected from the group consisting of N-methyl-2-pyrrolidone (NMP), γ-butyrolactone (GBL), N,N-dimethylacetamide (DMAc), propylene glycol monomethyl ether acetate (PGMEA), dimethyl sulfoxide (DMSO), cyclopentanone, cyclohexanone, 2-butanone, 2-heptanone and mixtures in any combination thereof;

wherein the amount of compound of formula (II) used to form the end capped polyimide of formula (IA) is about 2.5 mole percent or 3.4 mole percent based on total moles of dianhydride, diamine and compound of formula (II); and b) mixing a solution of the polyimide of formula (IA) with a photo radical generator, a photo acid generator and a crosslinking agent to form a composition;

c) coating the composition on a substrate;

d) exposing the coated substrate to actinic radiation through a mask to form an exposed film;

e) developing the exposed film in cyclopentanone; and f) curing the developed film at a temperature of about 170° C. to obtain the patterned film.

2. The process according to claim 1, wherein the compound of formula (II) is selected from the group consisting of:

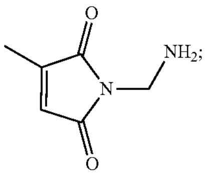

1-(aminomethyl)-3-methyl-1H-pyrrole-2,5-dione

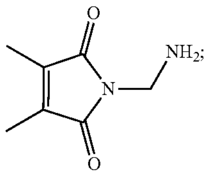

1-(aminomethyl)-3,4-dimethyl-1H-pyrrole-2,5-dione

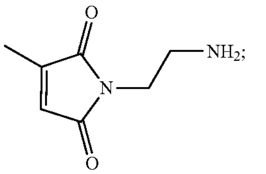

1-(2-aminoethyl)-3-methyl-1H-pyrrole-2,5-dione

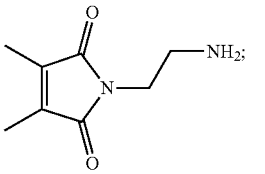

1-(2-aminoethyl)-3,4-dimethyl-1H-pyrrole-2,5-dione ($DMMIEt-NH_2$)

-continued

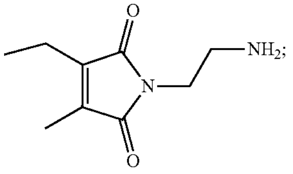

and 1-(2-aminoethyl)-3-ethyl-4-methyl-1H-pyrrole-2,5-dione

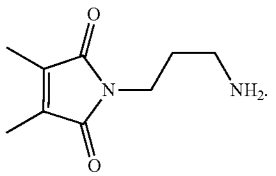

1-(3-aminopropyl)-3,4-dimethyl-1H-pyrrole-2,5-dione

3. The process according to claim 1, wherein the substrate is exposed to a radiation using a broad band mercury-vapor light source at a wavelength of about 365 nm.

4. The process according to claim 1, wherein the thickness of the patterned film is in the range of about 8 m to 10 m.

5. The process according to claim 1, wherein the end capped polyimide is selected from the group consisting of:

a polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and 1-(2-aminoethyl)-3,4-dimethyl-1H-pyrrole-2,5-dione ($DMMIEt-NH_2$); and a polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 4,4'-methylenebis(2,6-dimethylaniline) (DO3) and 1-(2-aminoethyl)-3,4-dimethyl-1H-pyrrole-2,5-dione ($DMMIEt-NH_2$).

6. The process according to claim 1, wherein the polyimide has a weight average molecular weight ($M_w$) of from 20,000 to 100,000.

7. The process according to claim 1, wherein the photo radical generator is 2-benzyl-2-(dimethylamino)-1-(4-morpholinophenyl)butan-1-one.

8. The process according to claim 1, wherein the photo acid generator is (4-methylphenyl)(4-isopropylphenyl)iodonium tetrakis(perfluorophenyl)borate.

9. The process according to claim 1, wherein the crosslinking agent is a mixture of 2,2'-(((2-ethyl-2-((oxiran-2-ylmethoxy)methyl)propane-1,3-diyl)bis(oxy))bis(methylene))-bis(oxirane) (TMPTGE) as an epoxy cross linker and (2,4,6-trioxo-1,3,5-triazinane-1,3,5-triyl)tris(ethane-2,1-diyl) triacrylate (TAEICY) as an acrylate cross linker.

10. A process for forming a patterned film comprising:

a) forming an organic solvent soluble end capped polyimide of formula (IB):

(IB)

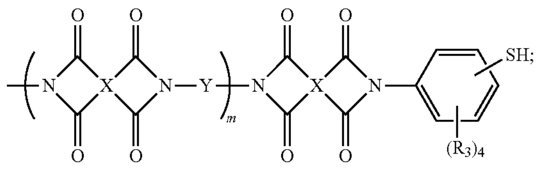

wherein:

m is an integer of at least 50;

X is derived from one or more dianhydrides selected from the group consisting of:

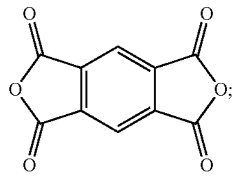

1H,3H-benzo[1,2-c:4,5-c′]-difuran-1,3,5,7-tetraone (PMDA)

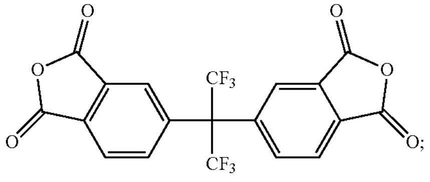

5,5′-(perfluoropropane-2,2-diyl)bis(isobenzofuran-1,3-dione) (6FDA)

Y is derived from one or more diamines selected from the group consisting of:

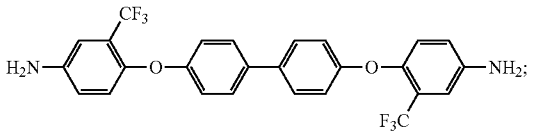 and 4,4′-([1,1′-biphenyl]-4,4′-diylbis(oxy))bis(3-trifluoromethyl)aniline) (6BF)

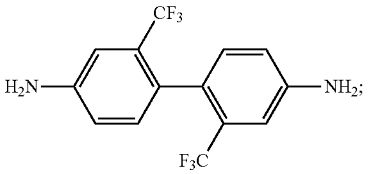

2,2′-bis(trifluoromethyl)-[1,1′-biphenyl]-4,4′-diamine (PFMB)

each of $R_3$ is independently selected from the group consisting of hydrogen, methyl, ethyl and linear or branched $(C_3\text{-}C_6)$alkyl; and by reacting the one or more dianhydrides, the one or more diamines, and a compound of formula (IV):

(IV)

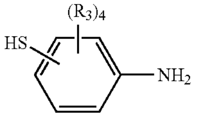

in N-methyl-2-pyrrolidone at room temperature to form a polyamic acid solution;

mixing the polyamic acid solution with cyclopentanone, acetic anhydride and pyridine, and heating the mixture at a temperature of about 100° C. for about four to eight hours in nitrogen atmosphere; and cooling to obtain the polyimide of formula (IB), wherein the polyimide of formula (IB) is soluble in an organic solvent selected from the group consisting of of N-methyl-2-pyrrolidone (NMP), γ-butyrolactone (GBL), N,N-dimethylacetamide (DMAc), propylene glycol monomethyl ether acetate (PGMEA), dimethyl sulfoxide (DMSO), cyclopentanone, cyclohexanone, 2-butanone, 2-heptanone and mixtures in any combination thereof;

b) mixing a solution of the polyimide of formula (IB) with a photo radical generator, a photo acid generator and a crosslinking agent to form a composition;

c) coating the composition on a substrate;

d) exposing the coated substrate to actinic radiation through a mask to form an exposed film;

e) developing the exposed film in cyclopentanone; and f) curing the developed film at a temperature of about 170° C. to obtain the patterned film.

11. The process according to claim 10, wherein the compound of formula (IV) is selected from the group consisting of:

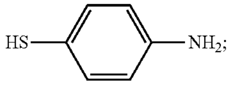

4-aminobenzenethiol

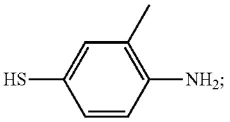

4-amino-3-methylbenzenethiol

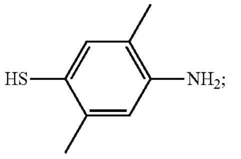

4-amino-2,5-dimethylbenzenethiol

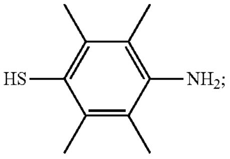

4-amino-2,3,5,6-tetramethylbenzenethiol

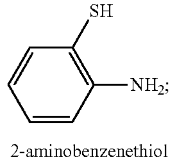

2-aminobenzenethiol ($2\text{-}NH_2PhSH$)

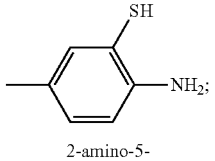

2-amino-5-methylbenzenethiol

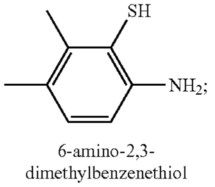

6-amino-2,3-dimethylbenzenethiol

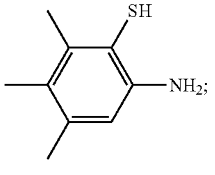 and 6-amino-2,3,4-trimethylbenzenethiol

-continued

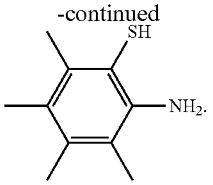

2-amino-3,4,5,6-tetramethylbenzenethiol

12. The process according to claim 10, wherein the substrate is expose to a radiation using a broad band mercury-vapor light source at a wavelength of about 365 nm.

13. The process according to claim 10, wherein the thickness of the patterned film is in the range of about 8 μm to 10 μm.

14. The process according to claim 10, wherein the end capped polyimide is a polyimide formed from 5,5'-(perfluoropropane-2,2-diyl)bis(isobenzofuran-1,3-dione) (6FDA), 1H,3H-benzo[1,2-c:4,5-c']difuran-1,3,5,7-tetraone (PMDA), 4,4'-([1,1'-biphenyl]-4,4'-diylbis(oxy))bis(3-(trifluoromethyl)aniline) (6BF), 2,2'-bis(trifluoromethyl)-[1,1'-biphenyl]-4,4'-diamine (PFMB) and 2-aminobenzenethiol (2-$NH_2$PhSH).

15. The process according to claim 10, wherein the end capped polyimide has a weight average molecular weight ($M_w$) of from 20,000 to 100,000.

16. The process according to claim 10, wherein the photo radical generator is 2-benzyl-2-(dimethylamino)-1-(4-morpholinophenyl)butan-1-one.

17. The process according to claim 10, wherein the photo acid generator is (4-methylphenyl)(4-isopropylphenyl)iodonium tetrakis(perfluorophenyl)borate.

18. The process according to claim 10, wherein the crosslinking agent is a mixture of 2,2'-(((2-ethyl-2-((oxiran-2-ylmethoxy)methyl)propane-1,3-diyl)bis(oxy))bis(methylene))-bis(oxirane) (TMPTGE) as an epoxy cross linker and (2,4,6-trioxo-1,3,5-triazinane-1,3,5-triyl)tris(ethane-2,1-diyl) triacrylate (TAEICY) as an acrylate cross linker.

* * * * *